(12) United States Patent
Chen et al.

(10) Patent No.: US 12,185,055 B2
(45) Date of Patent: Dec. 31, 2024

(54) MULTI-CAVITY PACKAGING FOR MICROELECTROMECHANICAL SYSTEM MICROPHONES

(71) Applicant: SKYWORKS SOLUTIONS, INC., Irvine, CA (US)

(72) Inventors: Guofeng Chen, Fremont, CA (US); Rakesh Kumar, Singapore (SG); You Qian, Singapore (SG); Michael Jon Wurtz, Lake Oswego, OR (US); Humberto Campanella-Pineda, Singapore (SG)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 185 days.

(21) Appl. No.: 18/045,887

(22) Filed: Oct. 12, 2022

(65) Prior Publication Data
US 2023/0269524 A1 Aug. 24, 2023

Related U.S. Application Data

(60) Provisional application No. 63/312,457, filed on Feb. 22, 2022.

(51) Int. Cl.
*H03G 5/00* (2006.01)
*H03G 5/16* (2006.01)
(Continued)

(52) U.S. Cl.
CPC ............. *H04R 1/245* (2013.01); *H03G 5/165* (2013.01); *H04R 1/04* (2013.01); *H04R 3/04* (2013.01);
(Continued)

(58) Field of Classification Search
CPC . H04R 1/245; H04R 1/04; H04R 3/04; H04R 19/04; H03G 5/165
See application file for complete search history.

(56) References Cited

U.S. PATENT DOCUMENTS 4,631,749 A 12/1986 Rapaich
8,204,252 B1 6/2012 Avendano
(Continued)

FOREIGN PATENT DOCUMENTS

CN 106921928 A 7/2017
WO 2015013698 A1 1/2015

*Primary Examiner* — Simon King
(74) *Attorney, Agent, or Firm* — Lando & Anastasi, LLP

(57) ABSTRACT

An electronic device package comprises an electronic acoustic device including a primary microphone having a frequency response having a resonance frequency, and a reference microphone having a frequency response including a resonance frequency. The primary microphone and the reference microphone are configured to substantially simultaneously receive a common acoustic signal to produce a transduced signal of the primary microphone and a transduced signal of the reference microphone, the resonance frequency of the reference microphone being different than the resonance frequency of the primary microphone. An equalization module is configured to equalize the frequency response of the microphone based on the transduced signal of the microphone and the transduced signal of the reference microphone. The package defines a first back cavity of the primary microphone and a second back cavity of the reference microphone, the second back cavity being acoustically isolated from the first back cavity.

24 Claims, 28 Drawing Sheets

(51) Int. Cl.
*H04R 1/04* (2006.01)
*H04R 1/24* (2006.01)
*H04R 3/04* (2006.01)
*H04R 19/04* (2006.01)

(52) U.S. Cl.
CPC ....... *H04R 19/04* (2013.01); *H04R 2201/003* (2013.01)

(56) References Cited

U.S. PATENT DOCUMENTS

| | | | |
|---|---|---|---|
| 8,351,634 B2 | 1/2013 | Khenkin | |
| 9,813,833 B1 | 11/2017 | Vesa | |
| 2003/0133588 A1* | 7/2003 | Pedersen | H04R 19/005 381/396 |
| 2005/0254673 A1* | 11/2005 | Hsieh | H04R 19/016 381/175 |
| 2010/0254547 A1* | 10/2010 | Grosh | B81B 3/0021 381/114 |
| 2011/0243343 A1* | 10/2011 | Gauger, Jr. | G10K 11/16 381/71.6 |
| 2014/0233756 A1* | 8/2014 | Inoda | H04R 1/38 381/91 |
| 2015/0289045 A1* | 10/2015 | Khenkin | H04R 19/005 381/150 |
| 2017/0048623 A1* | 2/2017 | Qutub | H04R 19/005 |
| 2020/0007992 A1* | 1/2020 | Koymen | H04R 31/006 |
| 2021/0400366 A1* | 12/2021 | LoPresti | H04R 19/04 |
| 2022/0276149 A1* | 9/2022 | Kuyken | G01N 21/1702 |
| 2023/0061686 A1* | 3/2023 | Wolfl | H04R 1/2853 |
| 2023/0121053 A1* | 4/2023 | Campanella-Pineda | H04R 19/005 381/111 |
| 2023/0269525 A1 | 8/2023 | Chen et al. | |
| 2023/0283963 A1 | 9/2023 | Chen et al. | |
| 2023/0328426 A1 | 10/2023 | Campanella-Pineda et al. | |

* cited by examiner

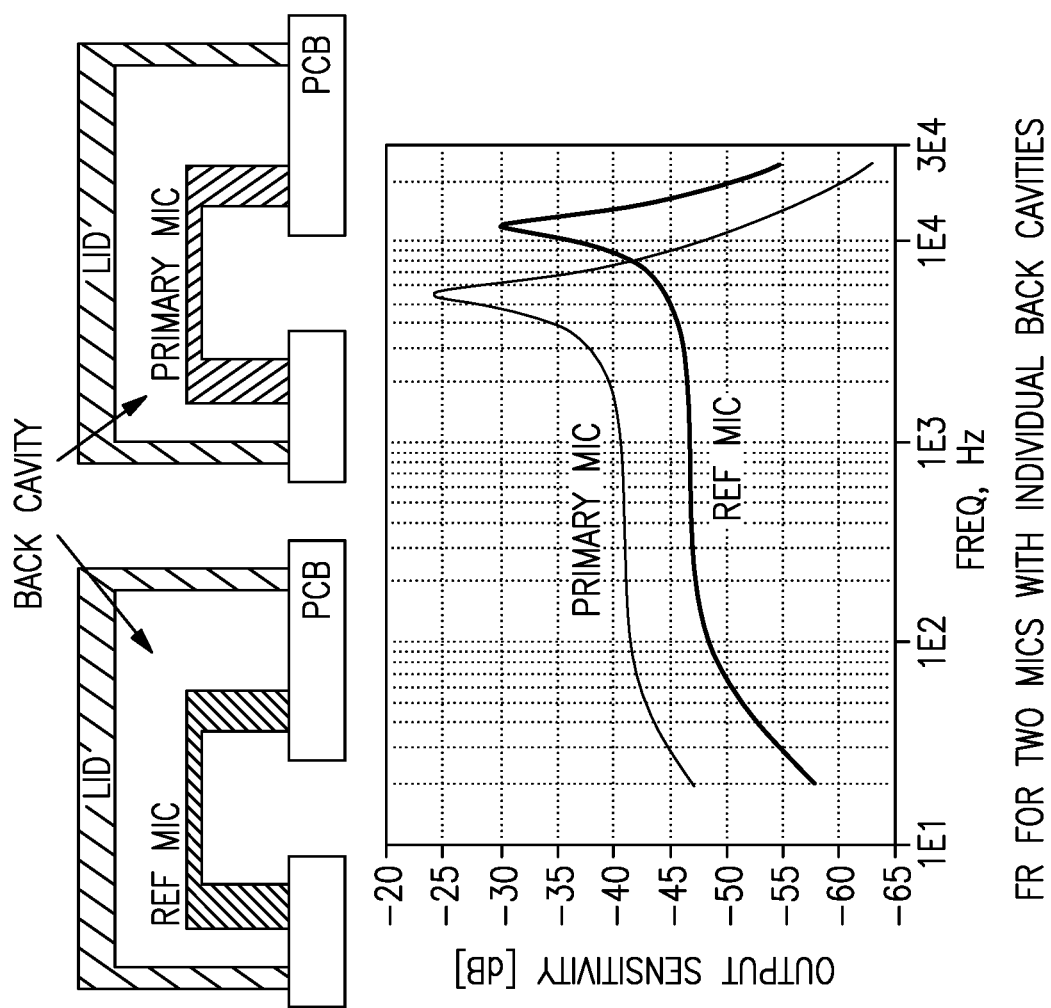
FIG.5A FR FOR TWO MICS WITH INDIVIDUAL BACK CAVITIES

FR FOR TWO MICS SHARING THE SAME BACK CAVITY

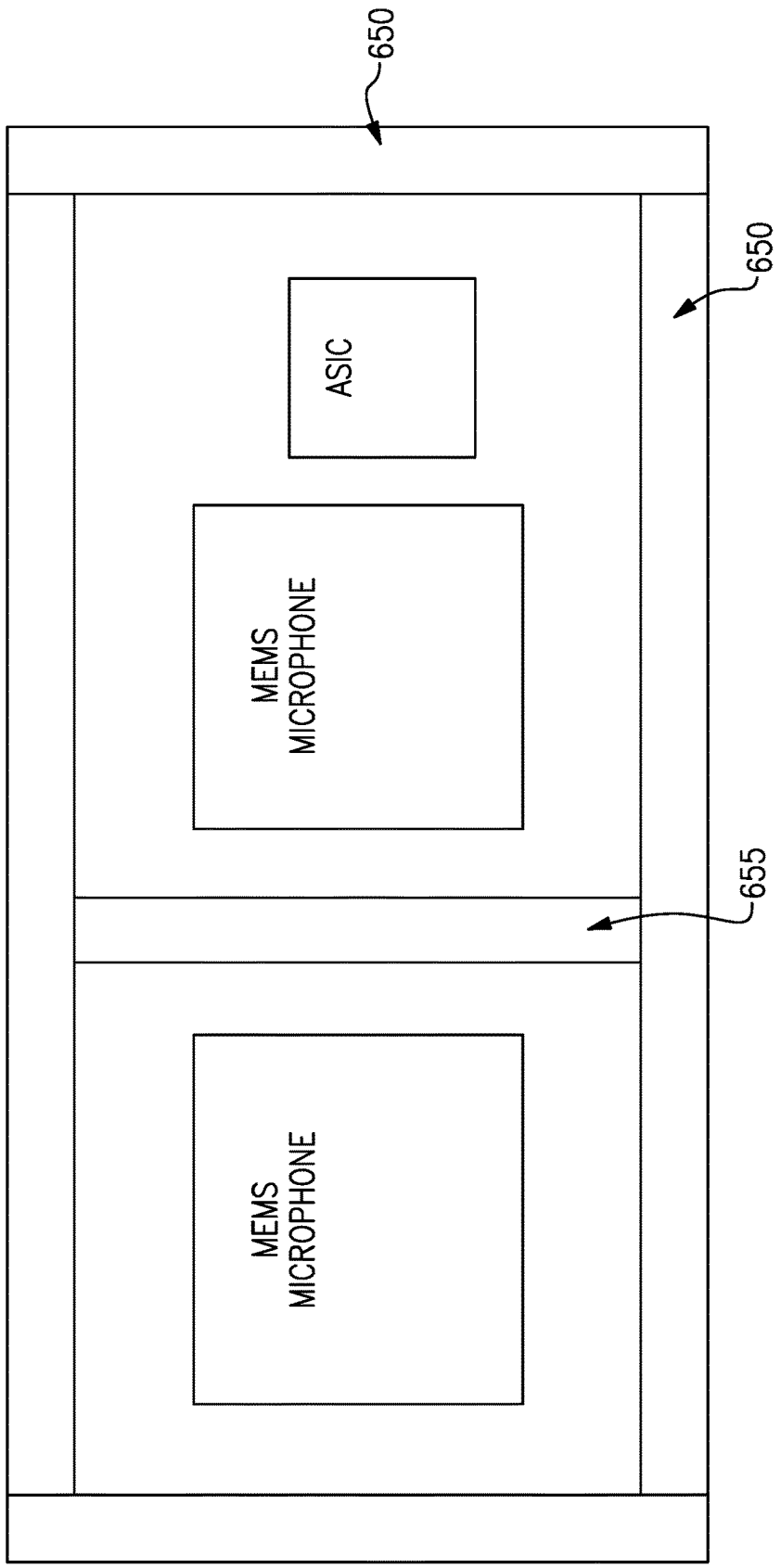

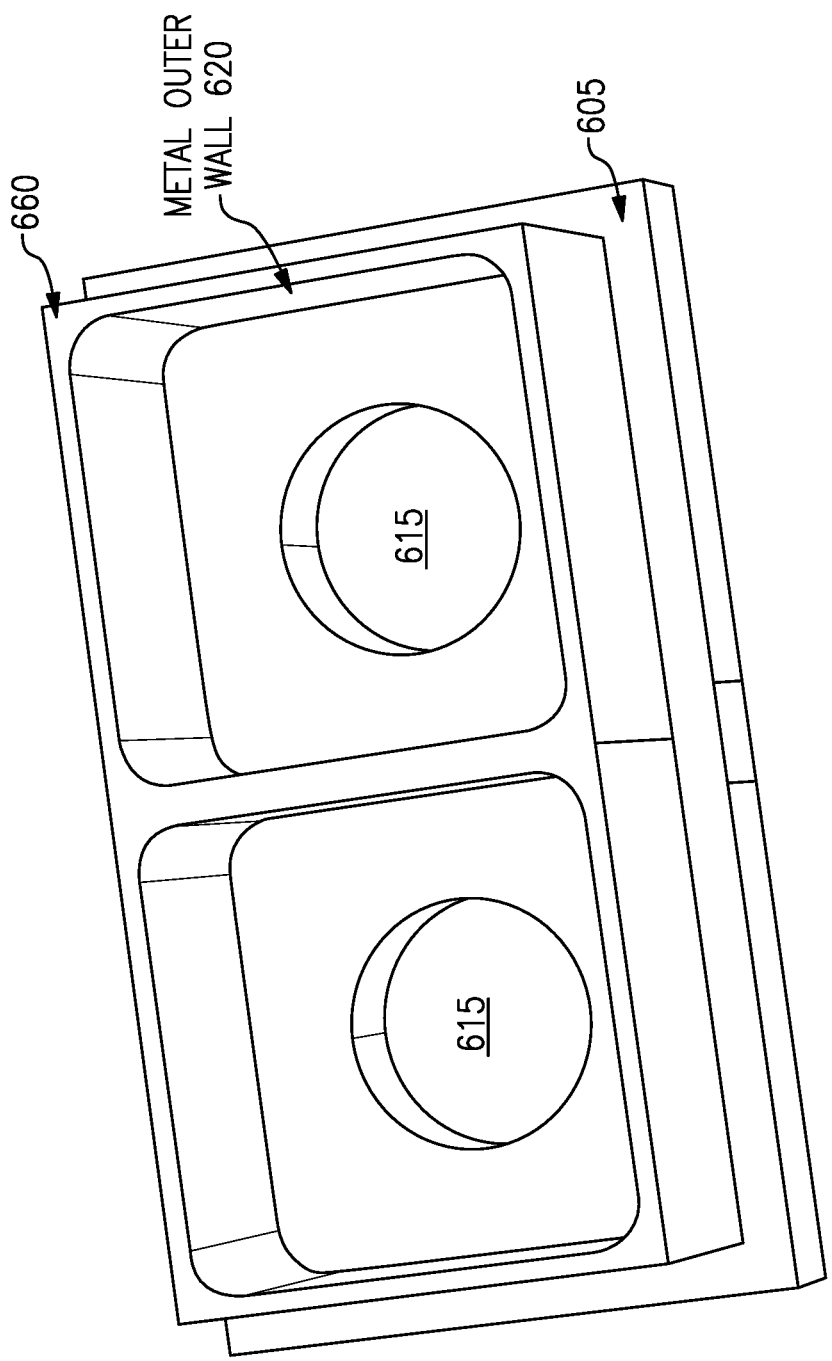

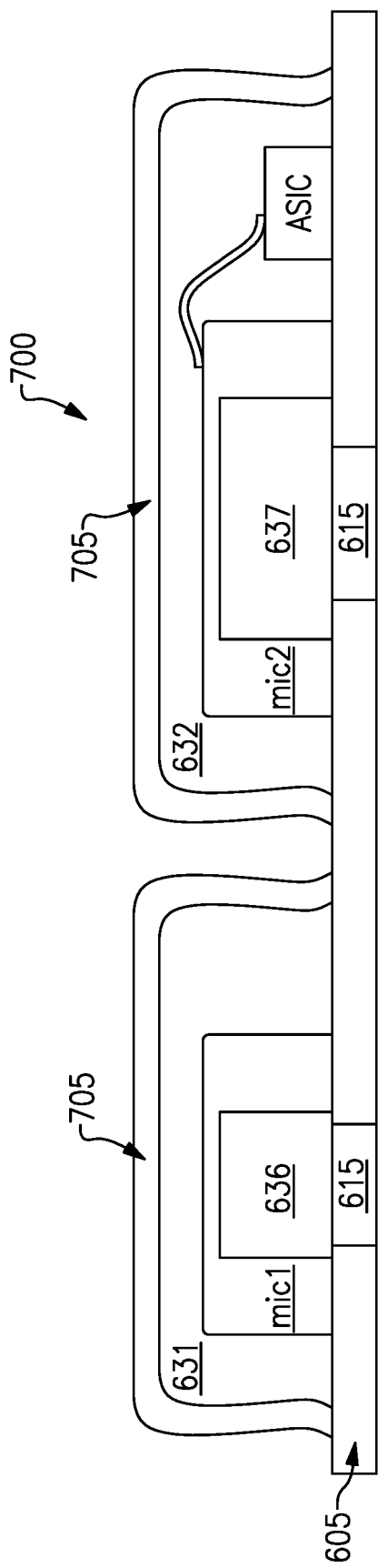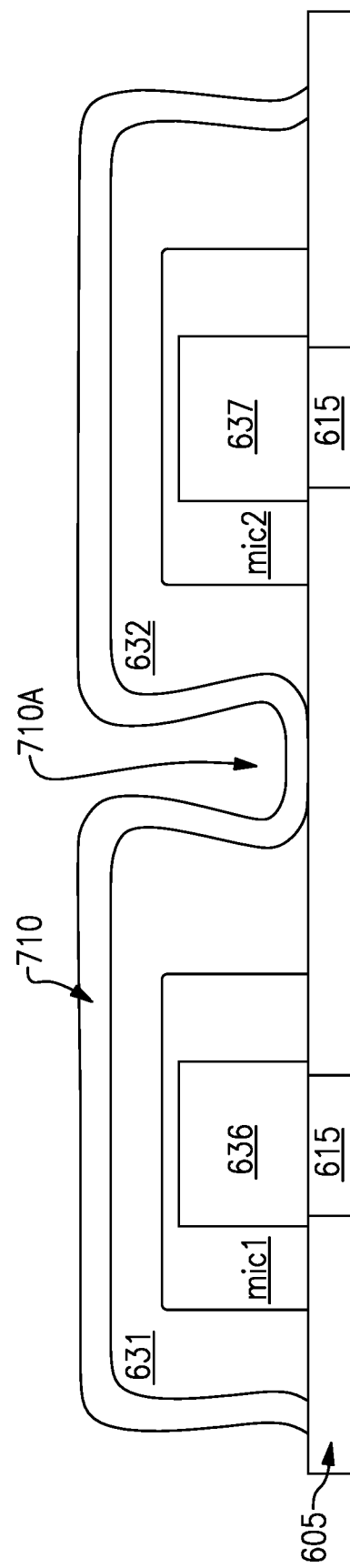

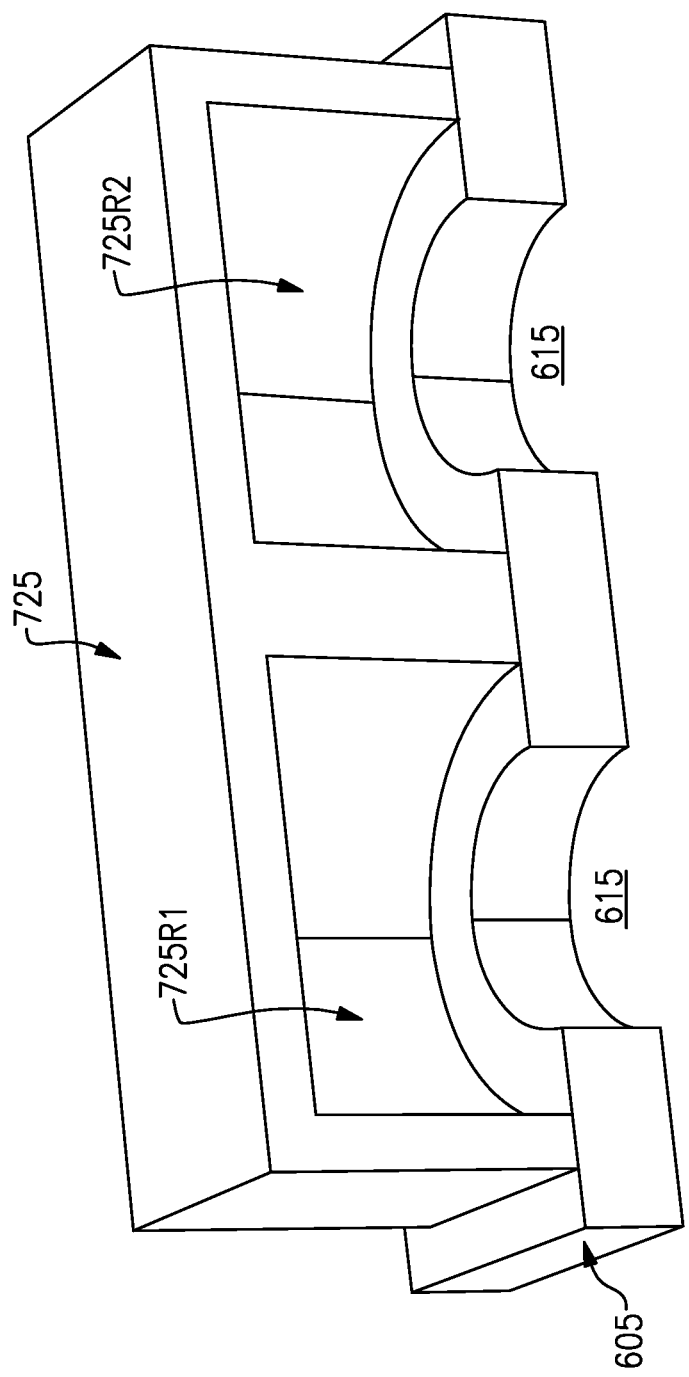

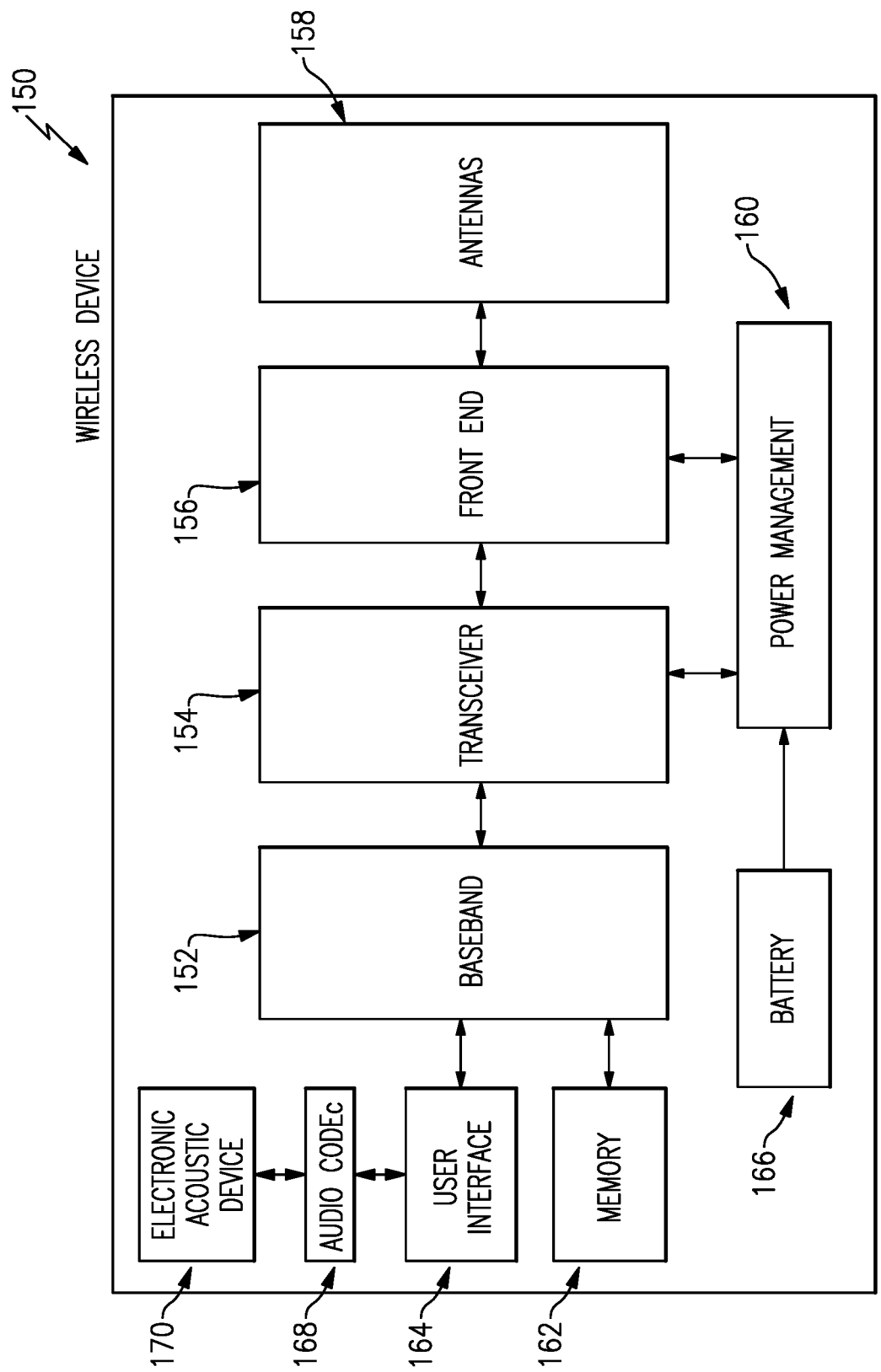

MULTI-CAVITY PACKAGING FOR MICROELECTROMECHANICAL SYSTEM MICROPHONES

CROSS-REFERENCE TO RELATED APPLICATIONS

This application claims priority under 35 U.S.C. § 119(e) to U.S. Provisional Patent Application Ser. No. 63/312,457, titled "MULTI-CAVITY PACKAGING FOR MICRO-ELECTROMECHANICAL SYSTEM MICROPHONES," filed Feb. 2, 2022, the entire contents of which is incorporated herein by reference.

BACKGROUND

Field

Embodiments of the invention relate to microelectromechanical systems (MEMS). More particularly, at least some embodiments are directed to frequency response equalization of MEMS transducers, such as microphones.

Description of the Related Technology

The frequency response of a transducer, such as a microphone is the frequency-specific output sensitivity of the transducer. Resonance occurs when a physical object or electronic circuit absorbs energy from an initial displacement or source, and then maintains the resultant mechanical or electrical vibrations without an additional force or energy acting on it. The frequency at which this vibration occurs is known as the resonant frequency or resonance frequency. The resonance frequency of a microphone is potentially troublesome when it shows up in the audio band as it may cause damage to the listener's ears and/or an inaccurate reproduction of the sound being sensed. Eliminating this resonance is important for successful microphone performance.

A MEMS microphone is a micro-machined electromechanical device used to convert sound pressure (e.g., voice sound) to an electrical signal (e.g., voltage). MEMS microphones are widely used in wireless devices, mobile devices, headsets, earpieces, speakers and other voice-interface devices or systems. Conventional capacitive MEMS microphones suffer from high power consumption (e.g., large bias voltage) and reliability, for example when used in a harsh environment (e.g., when exposed to dust and/or water).

Piezoelectric MEMS microphones have been used to address the deficiencies of capacitive MEMS microphones. Piezoelectric MEMS microphones offer a constant listening capability while consuming almost no power (e.g., no bias voltage is needed), and are robust and immune to water and dust contamination. Both conventional capacitive and piezoelectric MEMS microphones suffer from the problem of resonance in the audio band.

Prior attempts of eliminating or at least reducing resonance in MEMS microphones have included several different approaches. Some solutions add specific features in the microphone's structure to remove the resonance peak from the audio band. Other solutions include multiband processing to address the band around the resonance and to compensate for extra peaks in the frequency response. Another solution is to tailor the microphone's packaging to modify the resonance frequency, thereby pushing the resonance frequency out of the human perceivable audio band. The microphone could also be calibrated at the factory, using pink noise for example, to add a fixed frequency notch at the resonance frequency to compensate for the peak. However, none of these prior solutions offer a way to satisfactorily remove the resonance frequency from the audio band for a specific microphone once it has left the factory and is in the presence of unpredictable real-world noise.

SUMMARY

In accordance with one aspect, there is provided an electronic device package. The electronic device package comprises an electronic acoustic device including a primary microphone having a frequency response having a resonance frequency, a reference microphone having a frequency response including a resonance frequency, the primary microphone and the reference microphone configured to substantially simultaneously receive a common acoustic signal to produce a transduced signal of the primary microphone and a transduced signal of the reference microphone, the resonance frequency of the reference microphone being different than the resonance frequency of the primary microphone, and an equalization module configured to equalize the frequency response of the microphone based on the transduced signal of the microphone and the transduced signal of the reference microphone. The package defines a first back cavity of the primary microphone and a second back cavity of the reference microphone, the second back cavity being acoustically isolated from the first back cavity.

In some embodiments, each of the primary microphone and the reference microphone is a micro-electromechanical system (MEMS) microphone.

In some embodiments, both the first back cavity and the second back cavity are sealed.

In some embodiments, the package has a laminate-to-laminate structure in which a base of the package upon which the primary microphone and reference microphone are mounted includes a laminate board, and a ceiling of the package above the primary microphone and reference microphone also includes a laminate board.

In some embodiments, the package further comprises outer walls formed of a laminate board.

In some embodiments, the package further comprises a central wall separating a cavity defined by the base, ceiling, and outer walls into the first back cavity and the second back cavity.

In some embodiments, the package further comprises a conductive material coating internal portions of one of the base, ceiling, or outer walls.

In some embodiments, the package further comprises a conductive material coating external portions of one of the base, ceiling, or outer walls.

In some embodiments, the package further comprises a first metal wall surrounding the primary microphone and a second metal wall surrounding the reference microphone, the base, ceiling and first metal wall defining the first back cavity, the base, ceiling and second metal wall defining the second back cavity.

In some embodiments, the first and second metal walls are spaced from one another.

In some embodiments, wherein the first and second metal walls abut one another.

In some embodiments, the first and second metal walls are defined by apertures formed in a single metal plate.

In some embodiments, the package has a lid-on-laminate structure in which a base of the package upon which the primary microphone and reference microphone are mounted includes a laminate board, and a ceiling of the package above the primary microphone and reference microphone includes a metal lid.

In some embodiments, a first metal lid and the base define the first back cavity, and a second metal lid and the base define the second back cavity.

In some embodiments, a single metal lid includes a portion contacting the base between the reference microphone and the primary microphone, the base and the single metal lid defining both the first back cavity and the second back cavity.

In some embodiments, the package further comprises a wall extending from an upper surface of the base to a lower surface of the metal lid, the base, wall, and metal lid defining both the first back cavity and the second back cavity.

In some embodiments, the metal lid includes a metal block having first and second recesses defined therein, the base and first recess defining the first back cavity, the base and the second recess defining the second back cavity.

In some embodiments, the package has a lid-on-laminate structure in which a base of the package upon which the primary microphone and reference microphone are mounted includes a laminate board, a ceiling of the package above the primary microphone and reference microphone includes a metal lid, and a cap die is disposed over either the primary microphone and defines the first back cavity or is disposed over the reference microphone and defines the second back cavity.

In some embodiments, the base and metal lid define the one of the first back cavity or second back cavity not defined by the cap die.

In some embodiments, the cap die includes cap die walls formed of a polymer and a cap die lid, the cap die walls and cap die lid defining one of the first back cavity or the second back cavity.

In some embodiments, the package has a top port structure in which a base of the package upon which the primary microphone and reference microphone are mounted includes a laminate board, a ceiling and walls of the package above and surrounding the primary microphone and reference microphone includes a metal lid, and an acoustic port is defined in the metal lid.

In some embodiments, the base and metal lid define a front cavity that is shared by the primary microphone and reference microphone.

In some embodiments, the package has a top port structure in which a base of the package upon which the primary microphone and reference microphone are mounted includes a laminate board, a ceiling of the package above the primary microphone and reference microphone includes a laminate board, and an acoustic port is defined in the ceiling.

In some embodiments, the package further comprises outer walls formed of a laminate board, the base, ceiling, and outer walls defining a front cavity that is shared by the primary microphone and reference microphone.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral.

For purposes of clarity, not every component may be labeled in every figure. In the figures:

FIG. 5A illustrates the frequency response of two microphones having separate back cavities;

FIG. 6D is a plan view of the bottom laminate board of the package of FIG. 6A;

FIG. 6H illustrates an example in which the metal walls of the package of FIG. 6E may be formed from a single metal plate with apertures defining the inner sides of the metal walls;

FIG. 7A is a cross-sectional view of an example of a lid-on-laminate package for multiple microphones having separate back cavities for each microphone;

FIG. 7B illustrates an alternative configuration for the package of FIG. 7A;

FIG. 7E is a partial cut away isometric view of a portion of a package having the lid formed of the metal block of FIG. 7D;

FIG. 14 is a schematic diagram of a wireless device comprising a piezoelectric microelectromechanical systems microphone according to another embodiment.

DETAILED DESCRIPTION

Figure 1:
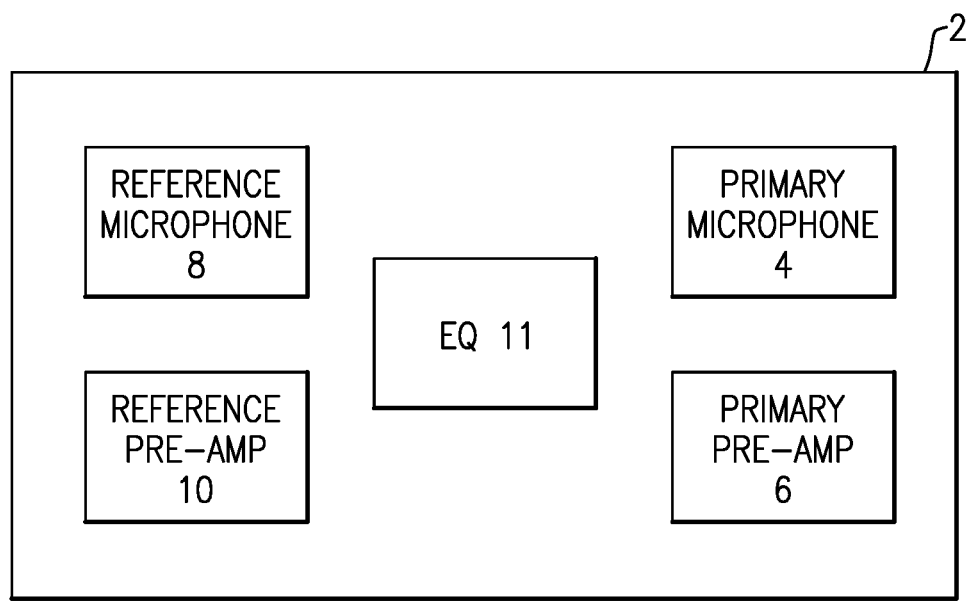
FIG. 1 is a block diagram of a microphone according to one embodiment.

Aspects and embodiments described herein are directed to frequency response equalization in MEMS transducers, such as microphones. Some of the technical issues in having microphone resonances in the audio band are high energy peaks/consumption causing damage to ears and/or electronics, unsolvable design tradeoffs of performance (e.g., sensitivity) versus resonance frequency to remove the resonance peaks from the audio band, increased group delay at resonance (e.g., delay distortion of voice and/or audio signals), and manufacturing, packaging, and other variations causing resonance frequency to be different from part to part.

To solve these technical issues, embodiments provided herein include equalization methods and electronic acoustic devices for equalizing the frequency response of a MEMS microphone including a primary MEMS microphone and a reference MEMS microphone, a packaging that encloses the primary and secondary microphones, as well as signal processing hardware (e.g., ASICs). To gain the benefits of embodiments disclosed herein, each of the primary and reference microphones are of the same type (although in some embodiments, the primary and reference microphones may be of different types), each has a different resonance frequency, and both microphones receive a signal to be transduced at substantially the same time. In an example, by the "same type," it is understood that both the primary and reference microphones have the same theoretical frequency response to the same/common acoustic excitation. The transduced signal of the reference microphone is used to equalize the transduced signal of the primary microphone, and more particularly, to equalize the resonance frequency of the primary microphone. Examples include both microphones being MEMS microphones. However, it should be appreciated that embodiments of the present invention are not limited to sound transducers (e.g., microphones), but may be adapted to other types of transducers, such as MEMS accelerometers or pressure transducers. An equalization method is provided that includes exciting both the primary and secondary microphones with the same/common signal, carrying out spectral estimations of the transduced signals, and finding best polynomial fittings of the transfer function of the primary microphone to generate an equalization function to remove the resonance peak of the primary microphone.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

All microphones have a resonance with most microphones having a very high Q factor (i.e., the ratio of a resonator's center frequency to its bandwidth when subject to an oscillating driving force), which can be a peak of ten times over the mid band sensitivity. Many microphones are condenser-type microphones and prior solutions of dealing with the resonance peak/spike is to push the spike beyond 20 kHz where it is nearly or entirely imperceptible to human hearing. However, when the resonance peak is pushed outside the audio band, the sensitivity of the microphone may be negatively impacted by as much as 20 dB or more.

Prior solutions of improving the frequency response of microphones include adding structures to the microphone or its packaging to move the resonance peak out of the audible range, as well as calibrating the microphone at the factory. However, such solutions are not well-suited for improving the frequency response of the microphone as the frequency response changes over time due to a variety of factors including aging components and effects from the environment. For example, the resonance frequency of a microphone can change as the physical structure of the microphone changes over time due to fluctuations in temperature, humidity, etc. When the resonance frequency changes, any previous calibration will no longer be optimal and structures added to the microphone or its packaging may not eliminate the peak resonance as they had done initially.

The ideal measurement from a microphone only includes the incoming audio signal without any distortion or noise. Any noise or signal that is picked up by the microphone that is not the audio signal will corrupt the microphone's estimate of the audio signal. Embodiments herein have the benefit of improving the microphone's (or other suitable transducer or sensor) estimate of the audio signal in the presence of any incoming energy (including noise).

The disclosed embodiments overcome current limitations in the prior art by providing MEMS microphones with high sensitivity and signal-to-noise (SNR) figures without tradeoffs in the frequency response (i.e., no peaks). Equalization methods use statistical signal processing, which is agnostic of primary and reference microphones, faster, and suitable for operation in noisy environments. System-on-Chip (SoC) embodiments of MEMS microphones secure accurate acoustic excitation conditions and simpler, cheaper packaging due to shared ports and front and back cavities with less sensitivity to intrinsic MEMS manufacturing process variations. Embodiments also include System-in-Package (SiP) implementations where each microphone is made in a separate process.

FIG. 1 is a block diagram of an electronic acoustic device 2 including a primary microphone 4, a primary pre-amplifier 6, a reference microphone 8, a reference pre-amplifier 10, and an equalization module 11. In certain embodiments the equalization module 11 is a digital signal processor (DSP) or DSP controller. In other embodiments, the equalization module 11 is one of a microcontroller, an ASIC controller, or a general purpose central processing unit (CPU). The electronic acoustic device 2 includes packaging (not shown in FIG. 1) that contains each of the primary microphone 4, the primary pre-amplifier 6, the reference microphone 8, the reference pre-amplifier 10, and the equalization module 11. Examples include the electronic acoustic device 2 being implemented as a SoC or a SiP.

The primary pre-amplifier 6 is electronically coupled to the primary microphone 4 and is configured to amplify the transduced signal output by the primary microphone 4. Likewise, the reference pre-amplifier 10 is electronically coupled to the reference microphone 8 and is configured to amplify the transduced signal output by the reference microphone 8. The equalization module 11 is electronically coupled to the primary pre-amplifier 6 and the reference pre-amplifier 10 and is configured to receive and process the transduced signals from the primary microphone 4 and the reference microphone 8.

To carry out the equalization methods and techniques disclosed herein, each of the primary microphone 4 and the reference microphone 8 has a different resonance frequency and is configured to receive the same acoustic signal. In one embodiment, the resonance frequency of the reference microphone 8 is higher than the resonance frequency of the primary microphone 4. In other embodiments, the resonance frequency of the reference microphone 8 may be lower than the resonance frequency of the primary microphone 4. It is understood that the equalization methods and techniques disclosed herein are applicable to both embodiments where the reference microphone 8 has a higher resonance frequency and embodiments where the reference microphone 8 has a lower resonance frequency than the primary microphone 4.

In certain examples, the primary microphone 4 has a lower resonance frequency than the reference microphone 8, and also has a higher sensitivity than the reference microphone 8. In this case, the resonance in the primary microphone can negatively impact the usability of the primary microphone's bandwidth. The frequency responses of the primary microphone 4 and the reference microphone 8 after their respective first resonance peaks can be more complex than before their respective first resonance peaks, with steep drops and raises in sensitivity and higher-order resonance peaks. In this scenario, any measurement of the acoustic and environmental conditions attempted with a lower-frequency reference microphone would be done in a region of its frequency response with many features and a non-flat sensitivity response, which makes the reference microphone less suitable for serving as a 'clean' reference when compared to a reference microphone with a lower resonance frequency response. Accordingly, in certain examples, a reference microphone having a first peak that is higher in its frequency response than a primary microphone is more desirable.

Figure 2A:
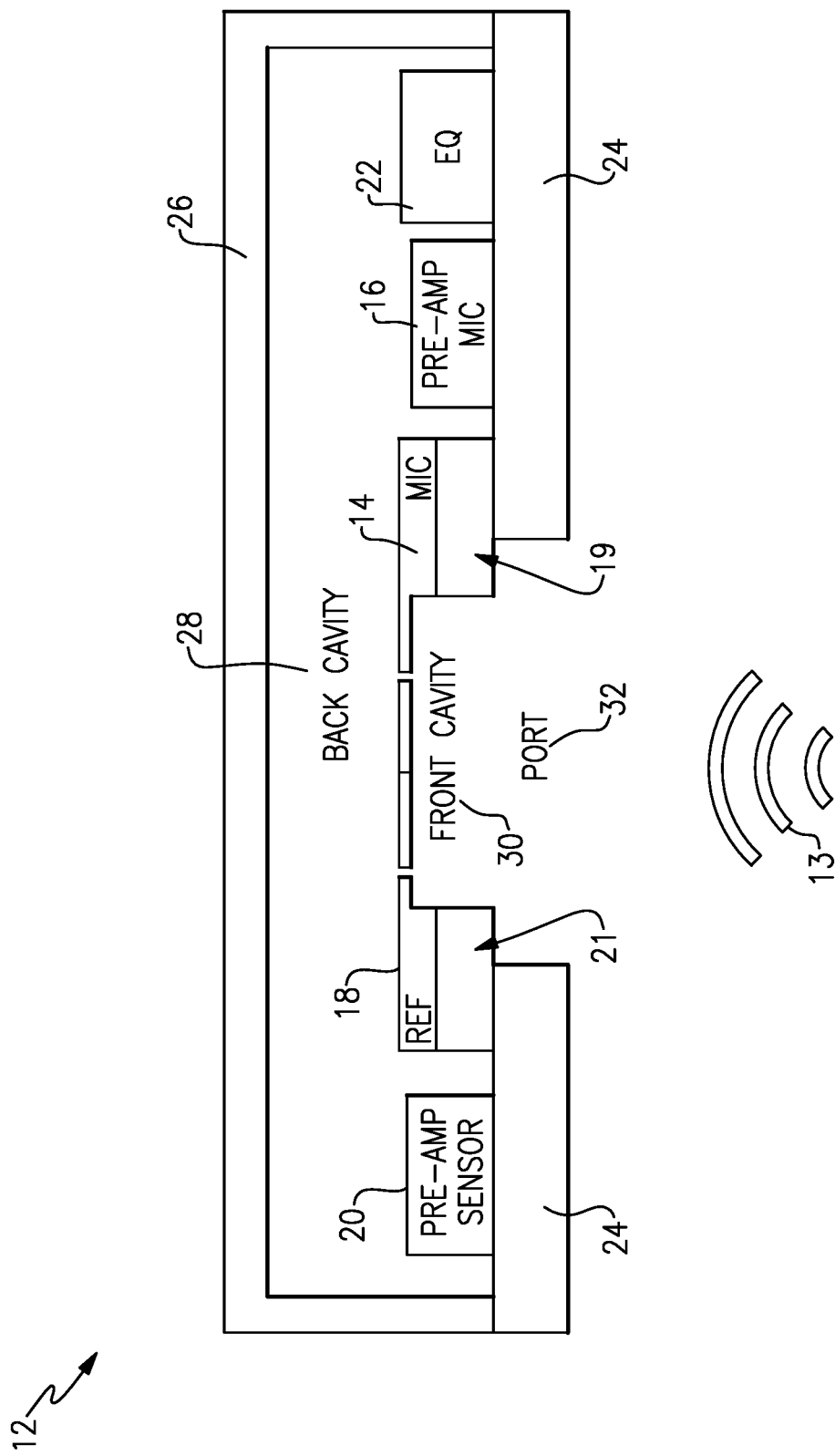
FIG. 2A is a cross-section of a microphone according to another embodiment.

FIG. 2A is a cross-section of an electronic acoustic device 12 including a primary MEMS microphone 14, a primary microphone pre-amplifier 16, a reference MEMS microphone 18, a reference pre-amplifier 20, an equalization module 22, a substrate 24, packaging 26, a back cavity 28, a front cavity 30, and a port 32. In certain embodiments, the substrate 24 is made of silicon. In other embodiments, the substrate 24 is a printed circuit board (PCB). The primary microphone 14 is supported by a support 19, which is, in some examples, made of silicon and coupled to the substrate 24, which is also made of silicon. Similarly, the reference microphone 18 is supported by a support 21, which is, in some examples, made of silicon and coupled to the substrate 24, which is also made of silicon. In an example, the primary microphone 14 and the reference microphone 18 are built on a silicon die singulated from a silicon wafer. In other examples, all of the primary MEMS microphone 14, the primary microphone pre-amplifier 16, the reference MEMS microphone 18, the reference pre-amplifier 20, and the equalization module 22 are produced as chips that are mounted on the substrate 24.

The back cavity 28 is defined by a volume contained within the packaging 26 and between the substrate 24 and the rest of the interior components. For purposes of brevity, relevant discussion of similar components (e.g., the pre-amplifier 16 and the pre-amplifier 6 from FIG. 1) is applicable to FIG. 2A and subsequently described embodiments and will not be repeated.

The electronic acoustic device 12 is configured to receive an acoustic signal 13 at the port 32, which is then channeled into the front cavity 30, and then channeled into the back cavity 28 such that the acoustic signal reflects onto both the reference microphone 18 and the primary microphone 14 substantially simultaneously. As used herein, the phrase "substantially simultaneously" is understood to mean ideally at the same time. In practical terms, it is near impossible for an acoustic wave to reach two co-located and co-planar sensors at exactly the same time (i.e., simultaneously). Hence, the electronic acoustic device 12 is designed to channel the incoming acoustic signal onto both microphones at as near the exact same time as possible, or substantially simultaneously. By ensuring that both microphones encounter and transduce the incoming signal at substantially the same time, the transduced signal from the reference microphone 18 can be used to remove the resonance peak of the primary microphone 14.

The back cavity 28 supports the operation and performance of the primary microphone 14 and the reference microphone 18 in several ways. First, the back cavity 28 finalizes the frequency response—the size of the back cavity 28 ultimately defines the resonance frequency of the primary microphone 14 and the reference microphone 18. Second and consequently, the back cavity 28 also determines other key performance parameters as the sensitivity and the noise/SNR of each microphone.

Each of the components depicted in FIG. 2A is built within the same SoC manufacturing process where both microphones 14, 18 use the same process layers while having different sensitivities and frequencies. The electronic acoustic device 12 can contain one or more ASICs for amplification, signal conditioning, and the equalization module 22.

As shown in FIG. 2A, the electronic acoustic device 12 includes two SoC devices: the reference microphone 18 and the primary microphone 14. However, the electronic acoustic device can include more than two SoC devices (not shown). For example, in addition to the reference microphone 18 and the primary microphone 14, an additional microphone may be provided.

Figure 2B:
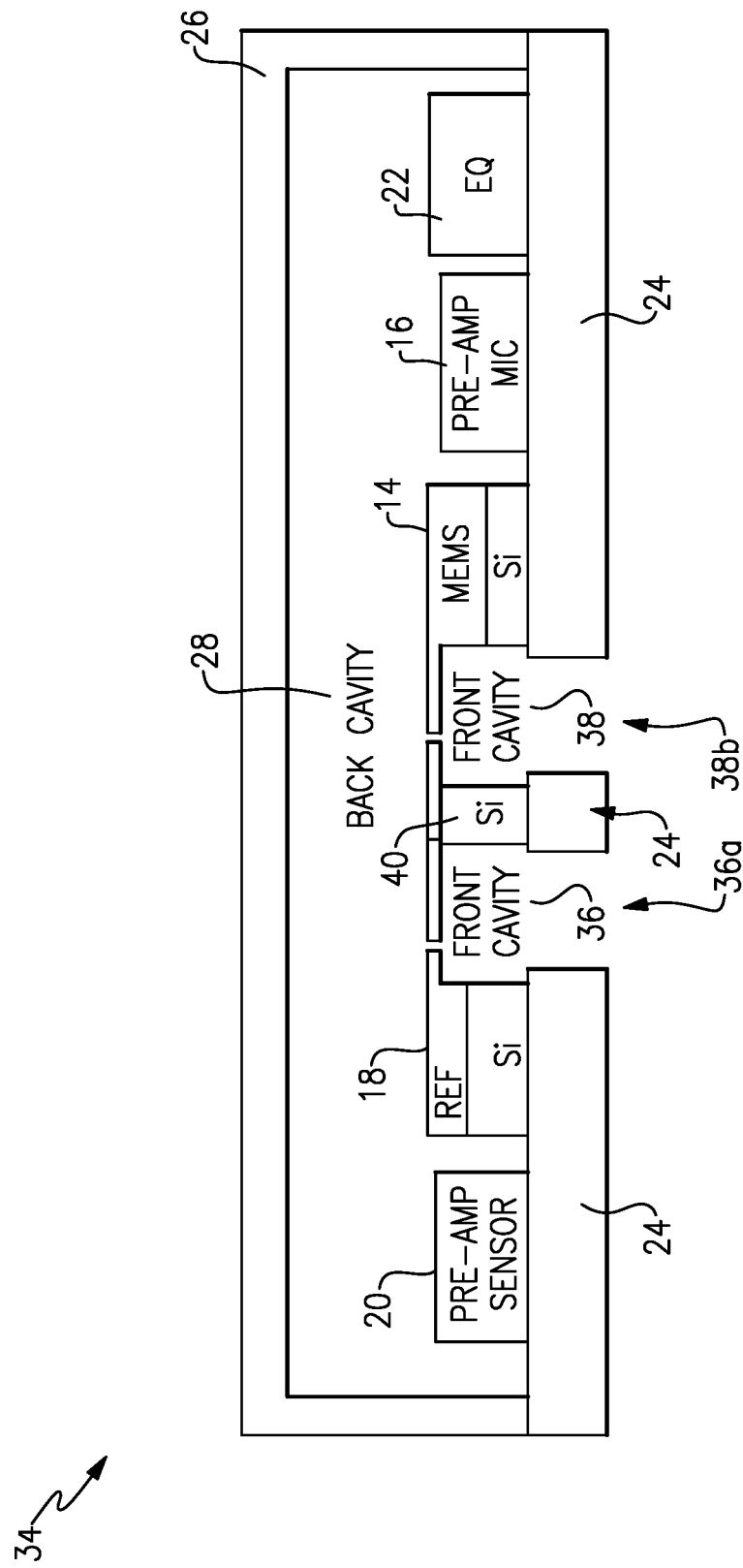
FIG. 2B is a cross-section of a microphone according to another embodiment.

FIG. 2B is a cross-section of an electronic acoustic device 34 that has a first front cavity 36 and a second front cavity 38. A first port 36a is provided near the first front cavity 36 to channel acoustic energy into the first front cavity 36. A second port 38b is provided near the second front cavity 38 to channel the acoustic energy into the second front cavity 38. Description of identically numbered elements in common with FIG. 2A will be omitted for brevity. In some examples, each of the primary microphone 14 and reference microphone 18 is constructed from a piezoelectric material formed atop a silicon substrate. As shown in FIG. 2B, the electronic acoustic device 34 includes silicon material forming layers that couple the microphones 14, 18 to the base substrate 24 which may be a silicon substrate or a printed circuit board (PCB) substrate. In an example, 'coupled' means connected, touching, and/or supporting. A silicon divider 40 is also utilized to separate the first cavity 36 from the second cavity 38. Providing a separate front cavity for each microphone assists in acoustically isolating the primary microphone 14 from the reference microphone 18.

Figure 3A:
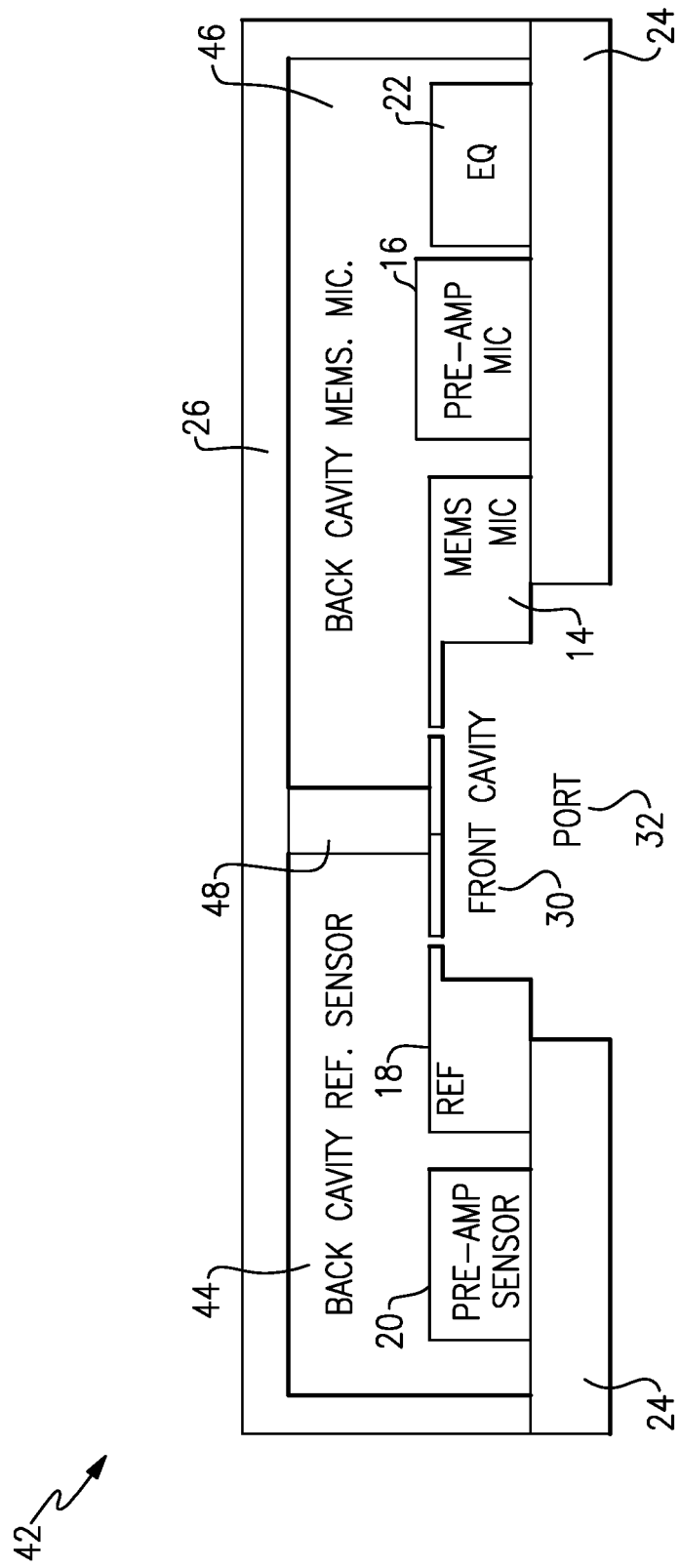
FIG. 3A is a cross-section of a microphone according to another embodiment.

FIG. 3A is a cross-section of an electronic acoustic device 42 that has a first back cavity 44 and a second back cavity 46 separated by a divider 48. In some examples the divider 48 is made of silicon. In other examples the divider is made of the same material as the packaging and is part of the packaging 26. Description of identically numbered elements in common with FIGS. 2A and 2B will be omitted for brevity. Providing a separate back cavity for each microphone assists in acoustically isolating the primary microphone 14 from the reference microphone 18.

Figure 3B:
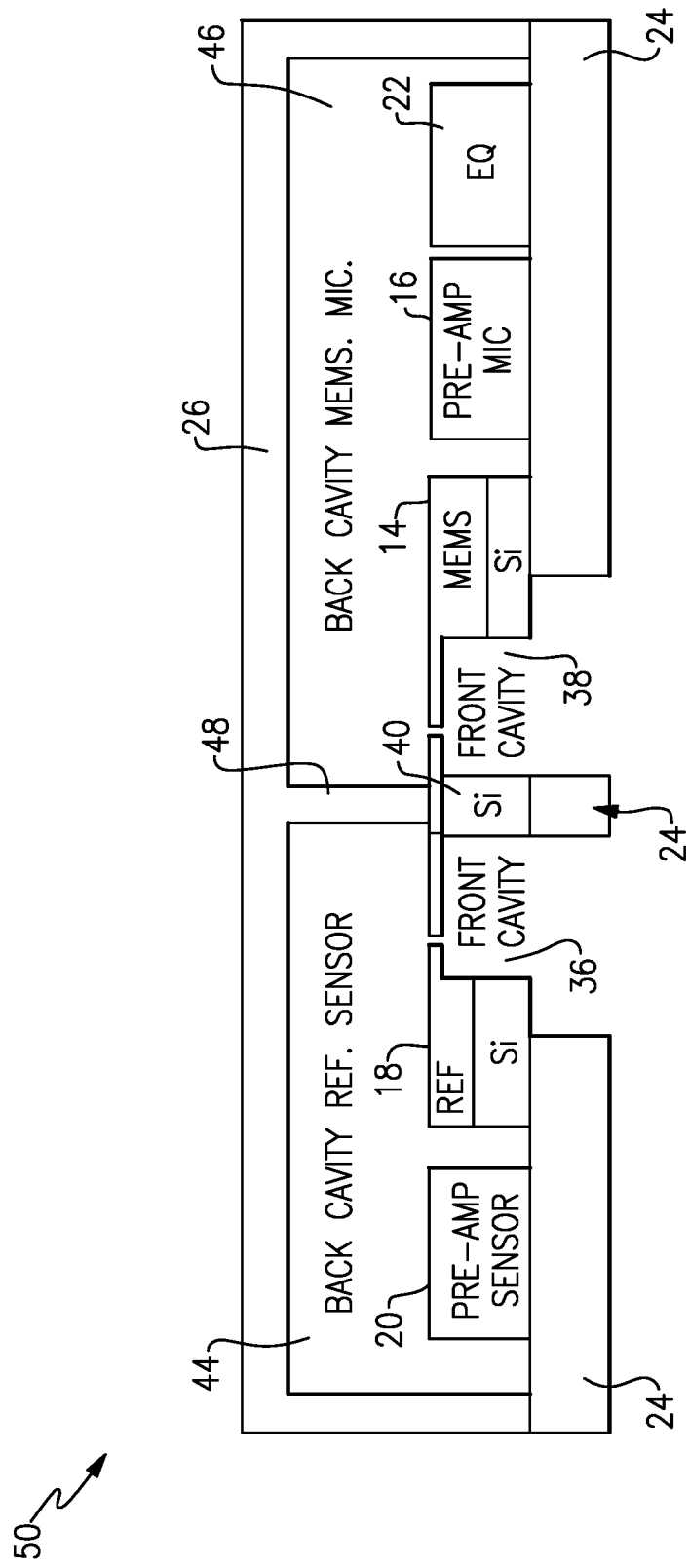
FIG. 3B is a cross-section of a microphone according to another embodiment.

FIG. 3B is a cross-section of an electronic acoustic device 50 that has the first back cavity 44 and the second back cavity 46 separated by the divider 48 as well as the first front cavity 36 and the second front cavity 38 separated by the divider 40. Providing both separate back cavities for each microphone as well as separate front cavities further assists in acoustically isolating the primary microphone 14 from interacting with the reference microphone 18.

Figure 4:
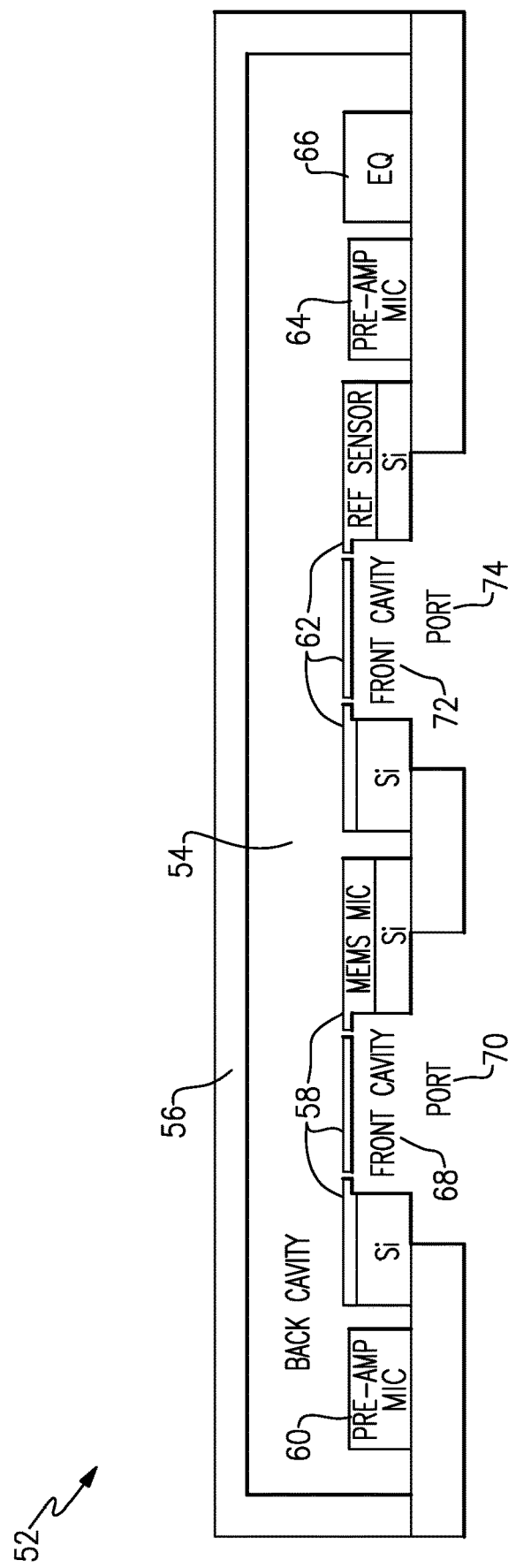
FIG. 4 is a cross-section of a microphone according to another embodiment.

FIG. 4 is a cross-section of an electronic acoustic device 52 with a single back cavity 54 that is surrounded by packaging 56. The electronic acoustic device 52 includes a primary MEMS microphone 58 and primary pre-amplifier 60, a reference microphone 62 and reference pre-amplifier 64, and an equalization module 66. While FIG. 4 depicts the primary MEMS microphone 58 and the reference microphone 62 as being diaphragm type piezoelectric microphones, in other embodiments, the electronic acoustic device can alternatively include cantilevered piezoelectric microphones. Further, the type of microphones utilized in the electronic acoustic device 52 is not limited to diaphragm and cantilever type piezoelectric microphones. Each microphone in the electronic acoustic device 52 is provided with a separate front cavity and port. The primary microphone 58 is provided with a front cavity 68 and a port 70. Similar to embodiments described above, the port 70 is configured to channel an incoming acoustic wave into the front cavity 68 to interact with the primary microphone 58. Likewise, the reference microphone 62 is provided with a front cavity 72 and a port 74, where the port 74 is configured to direct the same incoming acoustic wave into the front cavity 72 to interact with the reference microphone 62.

In certain embodiments, each of the primary microphone 58 and the reference microphone 62 may be built within a different manufacturing process and can be provided in two different chips, respectively, that are integrated at the packaging level. In one embodiment, this integration is part of constructing the electronic acoustic device 52 as a SiP. In an example of the electronic acoustic device 52, two or more ASICs are included for amplification—at least one for the primary microphone 58 and a second ASIC for the reference microphone 62, signal conditioning, and the equalization module 66. The packaging structure can be similar for both microphones, although in certain embodiments, modifications may be needed to accommodate their respective ASIC chips and design particularities.

Figure 5B:
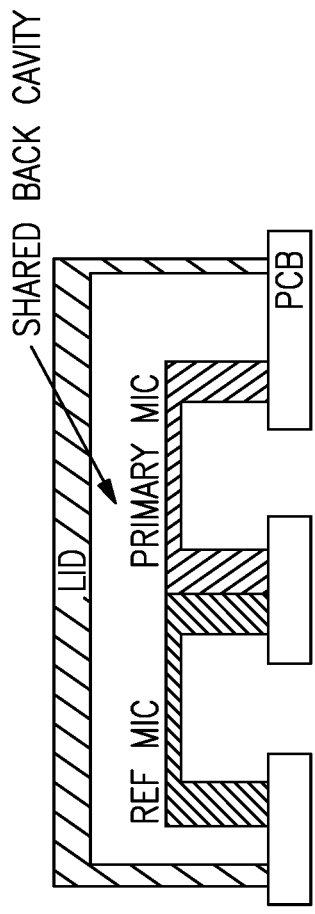
FIG. 5B illustrates the frequency response of two microphones sharing the same back cavity.
Figure 5B:
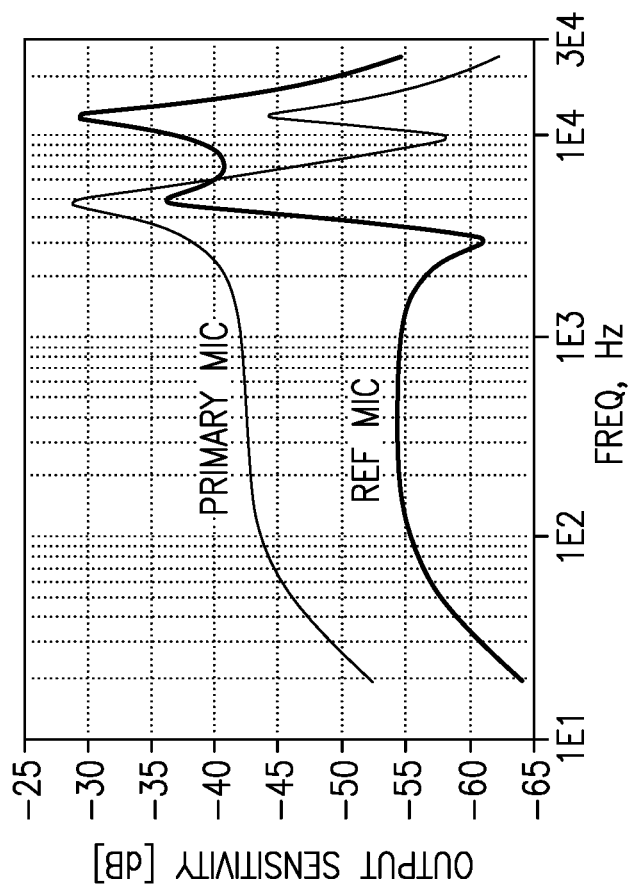

In some instances, providing both the primary microphone 58 and the reference microphone 62 in a package in which they share the same back cavity may result in acoustic coupling between the microphones. The coupling may create distortion in the Frequency Response (FR) and sensitivity loss of the microphones, rendering the performance of the microphones suboptimal. FIG. 5A schematically illustrates the frequency response of a primary microphone and a reference microphone provided in packages with separate back cavities. FIG. 5B illustrates the distortion in the frequency responses of the microphones if provided in a package in which they share a back cavity. Accordingly, in at least some embodiments, providing a package for a primary microphone and a reference microphone in which the back cavities of the two microphones are separate, for example, as illustrated in FIGS. 3A and 3B may be more desirable than proving a package for the two microphones in which they share the same back cavity, for example, as illustrated in FIG. 4. The following figures and description illustrate alternative packaging methods for packaging a primary microphone and a reference microphone together in which the two microphones have separate back cavities, for example, back cavities that are acoustically isolated from one another.

Figure 6A:
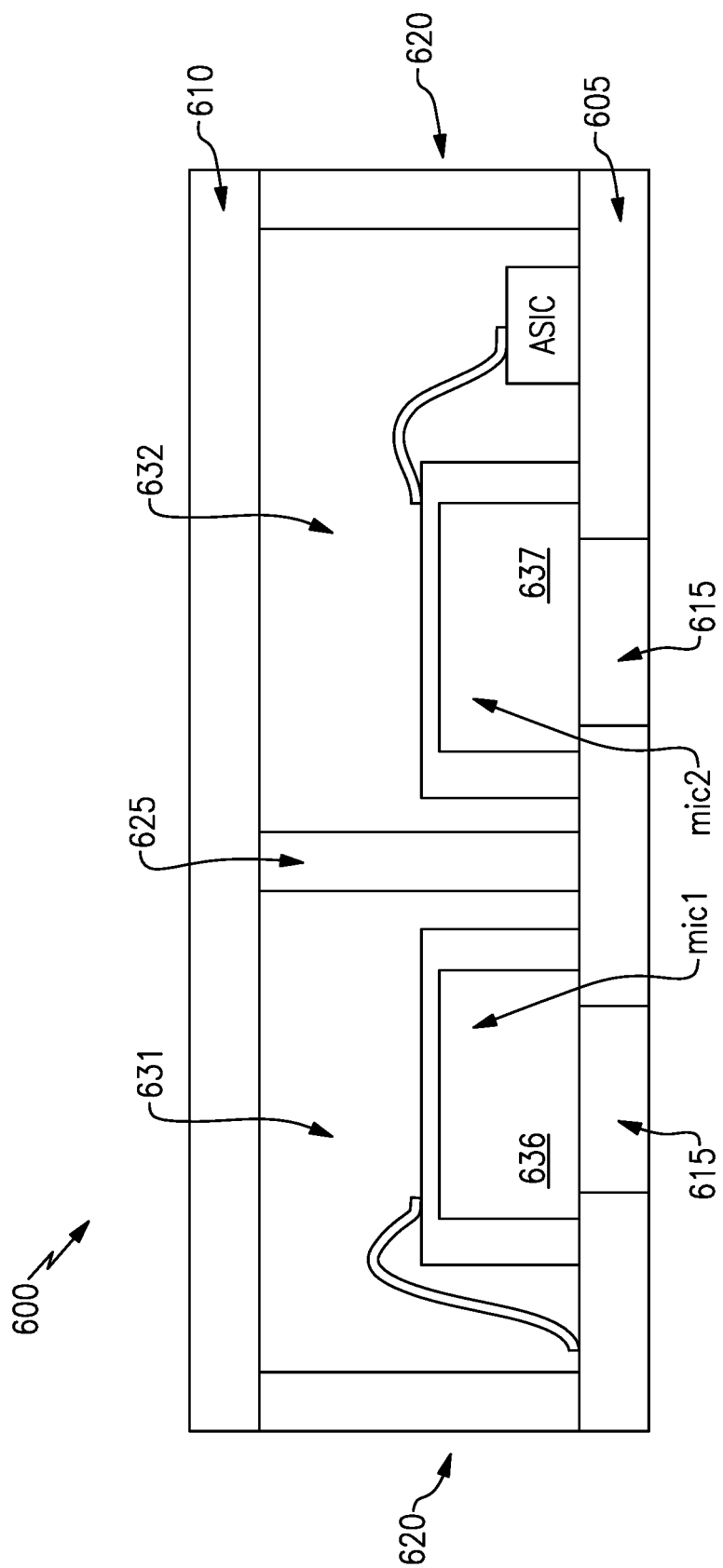
FIG. 6A is a cross-sectional diagram of an example of a laminate-on-laminate package for multiple microphones having separate back cavities for each microphone.

FIG. 6A is a cross-sectional illustration of a laminate-to-laminate type package 600 for two microphones as described herein, one of which being the primary microphone and the other being the reference microphone. The microphones in this figure as well as the other following figures of microphone packages are labelled mic1 and mic2, either of which may be the primary microphone and the other of which may be the reference microphone. The package 600 may include a base or bottom 605 formed of a laminate material, for example, a printed circuit board (PCB) and a ceiling or top 610 also formed of a laminate material, for example, a PCB. Acoustic ports 615 for the microphones are defined in the base 605. The base 605 and ceiling 610 are joined by outer walls 620 also formed of a laminate material, for example, a PCB. An interposer or central wall 625 also formed of a laminate material, for example, a PCB, together with the base 605, ceiling 610, and outer walls 620 define separate sealed back cavities 631, 632 for the two microphones. The interposer or central wall 625, the base 605, ceiling 610, and outer walls 620 may, in some embodiments all be formed of the same material. The back cavities 631, 632 in this package, as well as the back cavities in the other packages discussed below, are considered sealed even though apertures or slits in the membranes of the microphones may allow some passage of air between the back cavities and the front cavities 636, 637 of the microphones and the acoustic ports. An ASIC chip in electrical communication with one or both of the microphones may be placed in one of the back cavities or outside of the package.

Figure 6B:
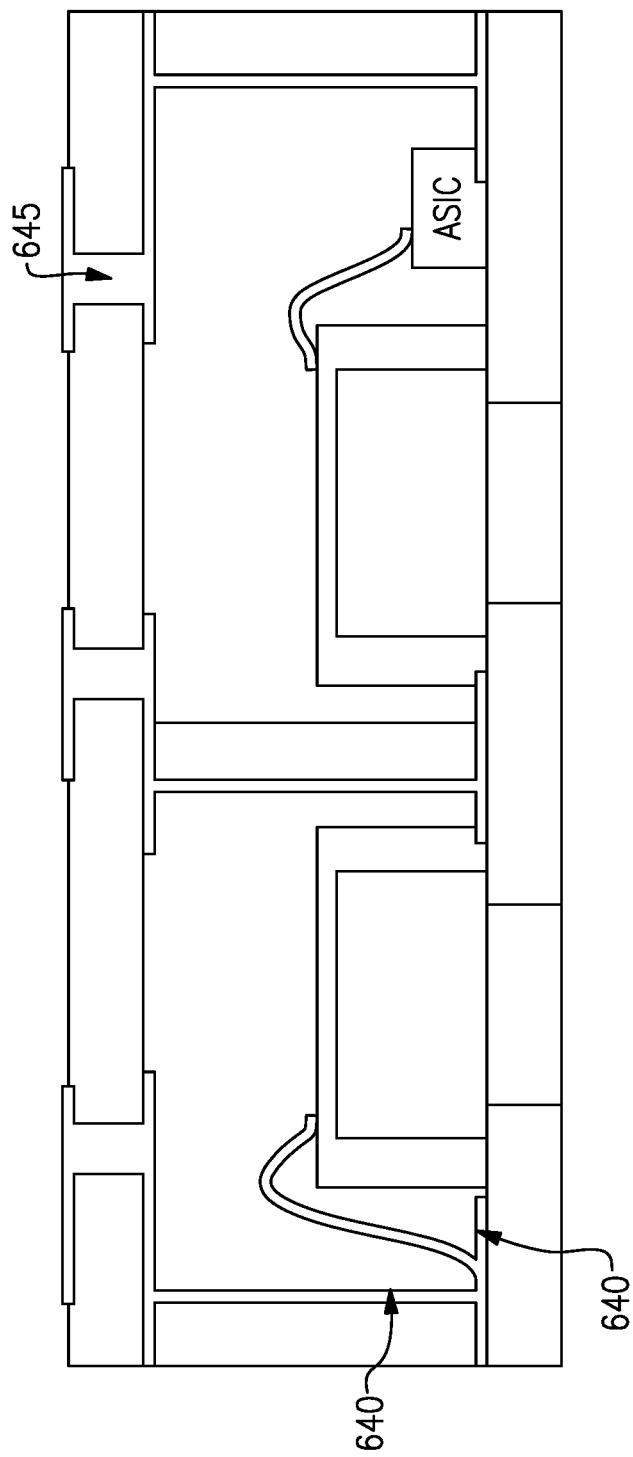
FIG. 6B illustrates a modification to the package of FIG. 6A including coatings of conductive material and a an electrical via.

FIG. 6B illustrates a modification to the package of FIG. 6A in which only the features that are different from the package 600 of FIG. 6A are labelled. The package of FIG. 6B includes coatings 640 of a conductive material, for example, copper or another metal on internal portions of the base 605, ceiling 610, and outer walls 620, and PCB vias 645. By coating the walls with conductive material, electrical routing can also be implemented with this package to provide electrical signal paths from bottom PCB to the top PCB. The electrical routing of the MEMS microphones and ASIC can be done by wire-bonding from the MEMS microphone die and ASIC die to the bottom PCB or to the top PCB. Other methods of mounting the MEMS microphone die to the package, for example, flip-chip mounting, are also possible. The coating 640 of conductive material can also be used to provide shielding against electromagnetic interference (EMI) and radio frequency interference (RFI) to reduce electronic malfunction susceptibility by blocking unwanted external electromagnetic waves or preventing internal electromagnetic waves from emitting from the package and interfering with other circuits or devices. To provide this functionality the coating 640 of conductive material may additionally or alternatively be disposed on outside surfaces of the base 605, ceiling 610, and outer walls 620 of the package, as illustrated in FIG. 6C.

Figure 6C:
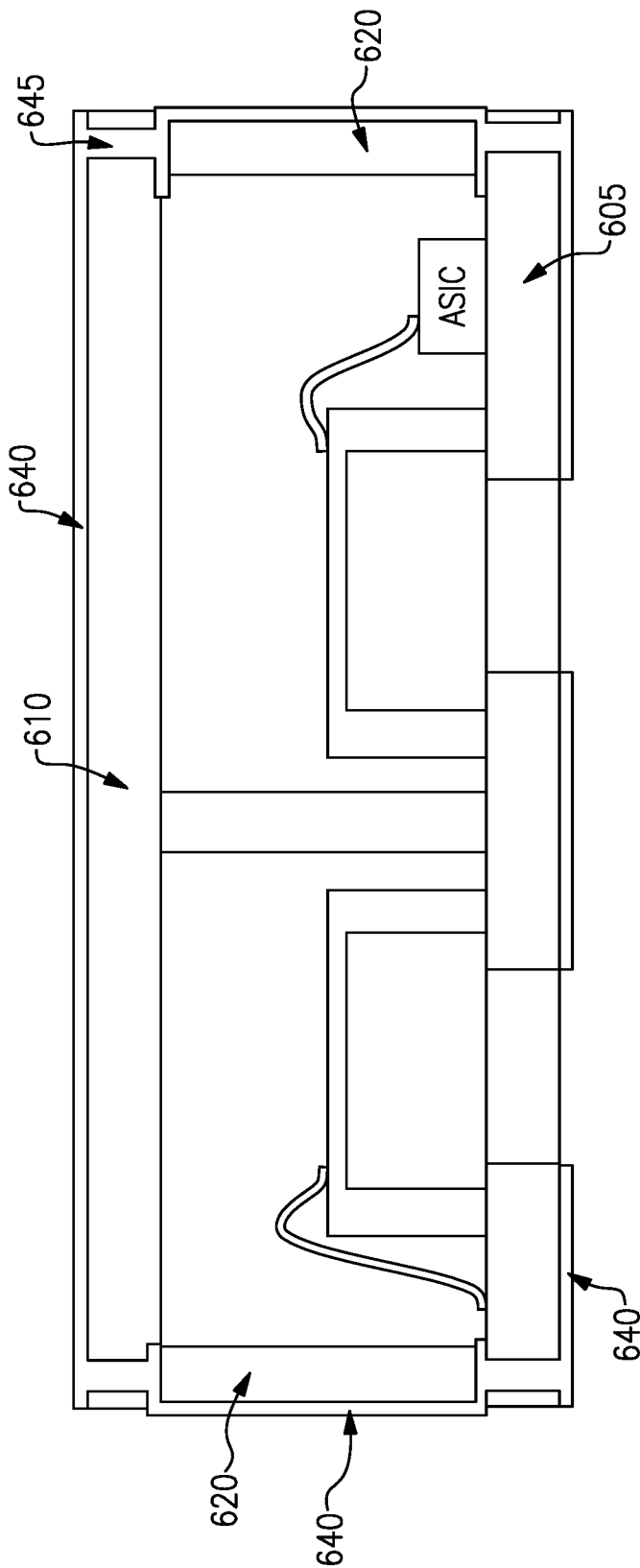
FIG. 6C illustrates a modification to the package of FIG. 6A including an outer coating of conductive material.

A top view of the bottom PCB 605 of the packages of any of FIGS. 6A-6C is shown in FIG. 6D. The edge of the bottom PCB 605 has certain areas 650 reserved for the bonding of the outer walls 620. Inside the bottom PCB 605 within the area defined by the edges of the bottom PCB 605, extra area(s) 655 are reserved for the bonding of interposer or central wall(s) 625 to separate the microphones. In the examples of FIGS. 6A-6D, two microphones are placed within their individual back cavities, eliminating or reducing the acoustic coupling between them. More than two microphones can also be provided in packages in accordance with this method. As noted above, an ASIC (Application-Specific Integrated Circuit) chip in electrical communication with one or both of the microphones can be placed in one of the back cavities or outside of the package.

Figure 6E:
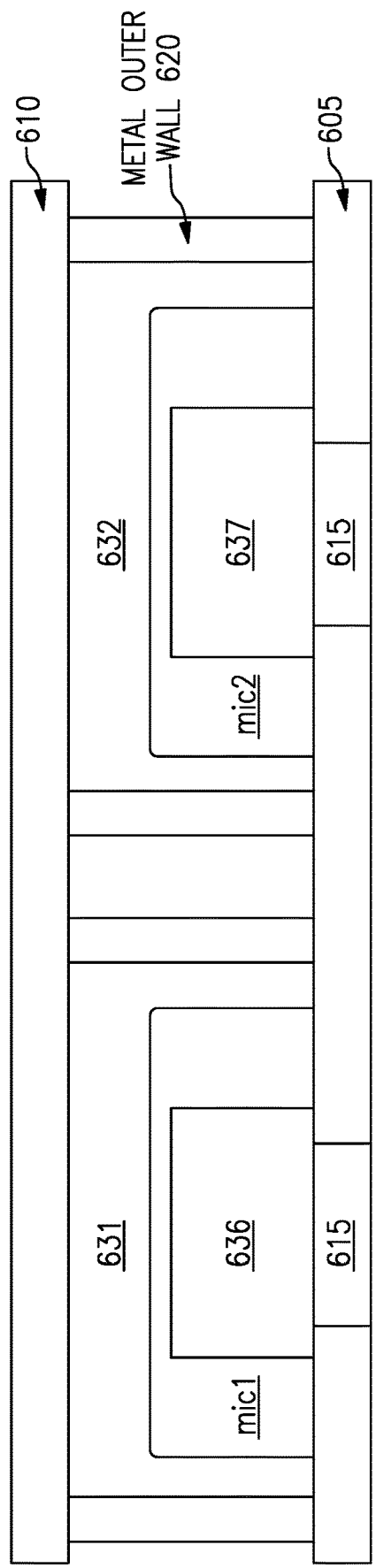
FIG. 6E illustrates a modification to the package of FIG. 6A including metal outer walls around each microphone.
Figure 6F:
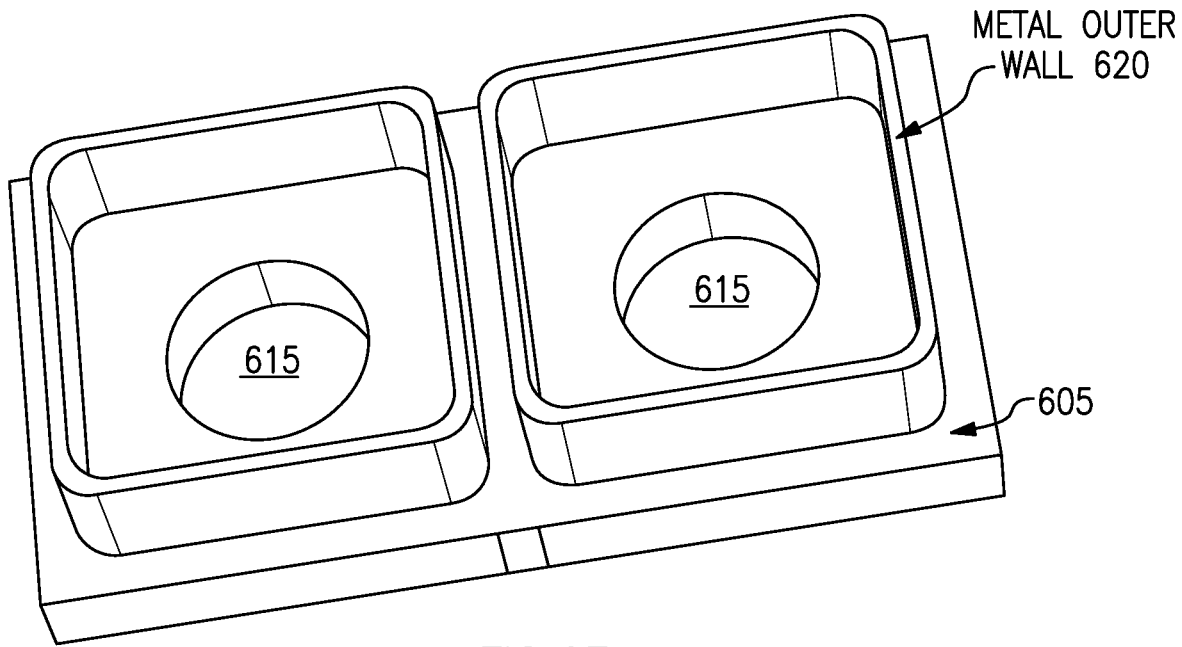
FIG. 6F illustrates an example of an arrangement of the metal walls of the package of FIG. 6E.
Figure 6G:
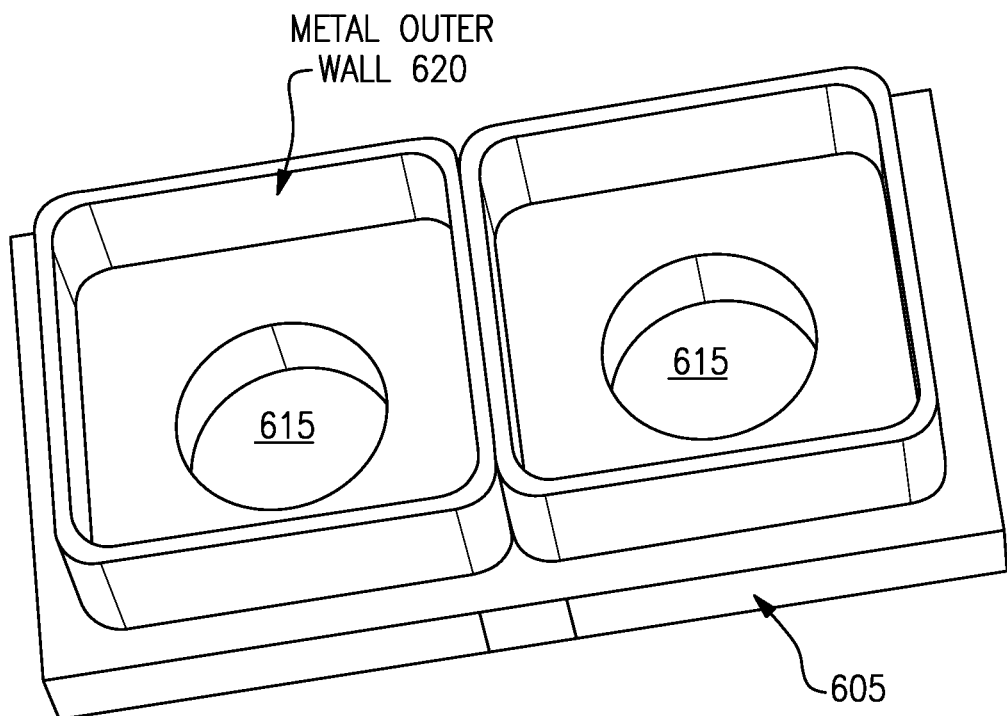
FIG. 6G illustrates another example of an arrangement of the metal walls of the package of FIG. 6E.

In another variation of the package 600 of FIG. 6A, the outer walls 620 may be formed of metal, for example, copper, aluminum, or another suitable metal. The metal outer walls 620 may extend from the upper surface of the bottom PCB 605 to the lower surface of the top PCB 610 and surround each of the microphones. The metal outer walls may help provide shielding for the microphones and any other circuitry within the metal outer walls against electromagnetic interference. An example of this variation is shown in FIG. 6E in cross-sectional view. As illustrated in FIGS. 6F and 6G in isometric views showing only the bottom PCB 605 and metal outer walls 620, the metal outer walls may be spaced apart from one another (FIG. 6F) or may abut one another (FIG. 6G). In a further variation illustrated in FIG. 6H the outer walls may be defined by apertures cut in a single metal block or plate 660.

Another form of packaging for defining separate back cavities for a primary microphone and a reference microphone in the same package is referred to herein as lid-on-laminate packaging. In one example of a lid-on-laminate package, indicated generally at 700 in FIG. 7A, two lids 705 may be disposed over the microphones, one lid for each microphone, on the same laminate or PCB base or bottom 605. The metal lids 705 seal the back cavities 631, 632 of each of the microphones mic1, mic2.

Figure 7C:
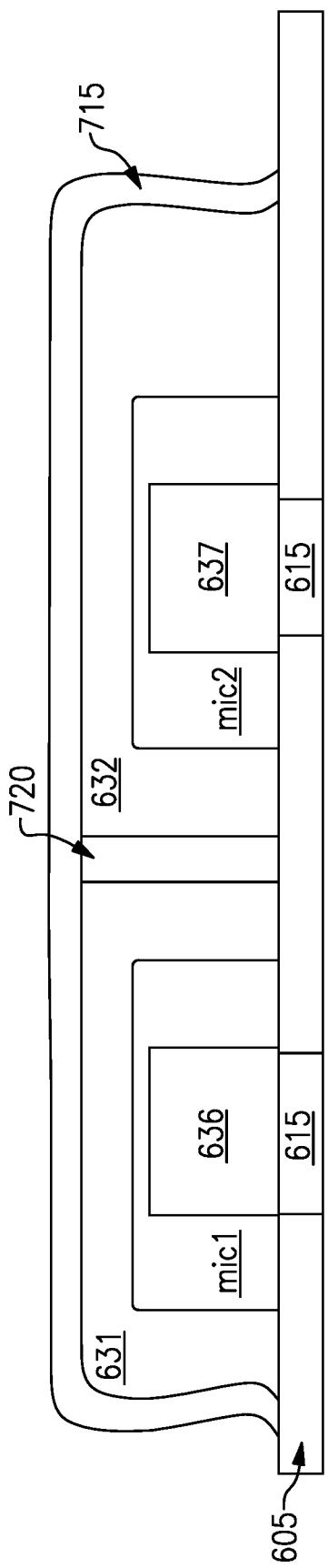
FIG. 7C illustrates another alternative configuration for the package of FIG. 7A.

Instead of using two separate metal lids 705 to define the back cavities for the microphones, as in the embodiment of FIG. 7A, one may utilize a single metal lid structure 710 in which a region 710A of the lid structure 710 is pressed downward into contact with the laminate or PCB base or bottom 605 to separate the back cavities 631, 632 from one another so pressure applied to one of the back cavities does not propagate to the other. An example of this type of package is illustrated in cross-section in FIG. 7B. Alternatively, one may utilize a single metal lid 715 in addition to a wall 720 extending downward from the lower surface of the metal lid 715 to the upper surface of the laminate or PCB base or bottom 605 to define and acoustically separate the back cavities 631, 632, as illustrated in cross-section in FIG. 7C.

Figure 7D:
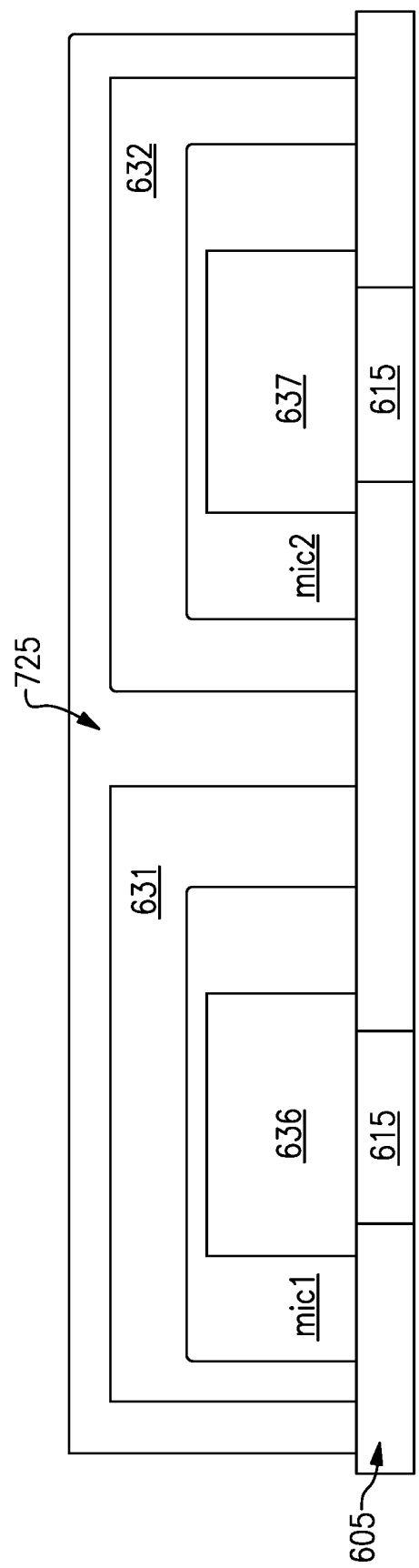
FIG. 7D is a cross-sectional view illustrating that the lid of the package of FIG. 7A may be formed from a metal block including a pair of recesses.

In a further embodiment of a lid-on-laminate package, illustrated in cross-section in FIG. 7D and in a cut away isometric view in FIG. 7E, the metal lid may be formed from a single metal block 725 with recesses 725R1, 725R2 defined in the metal block to define the outer walls of the cavities 631, 632.

Figure 8A:
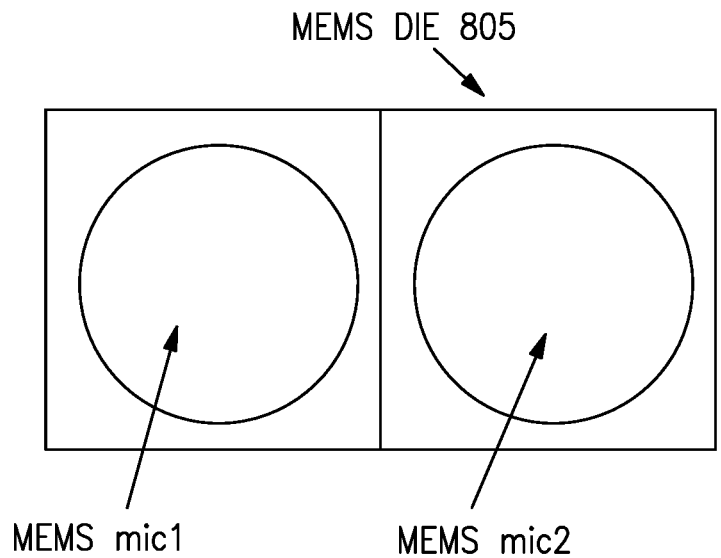
FIG. 8A is a plan view of a die including two piezoelectric microelectromechanical systems microphones.
Figure 8B:
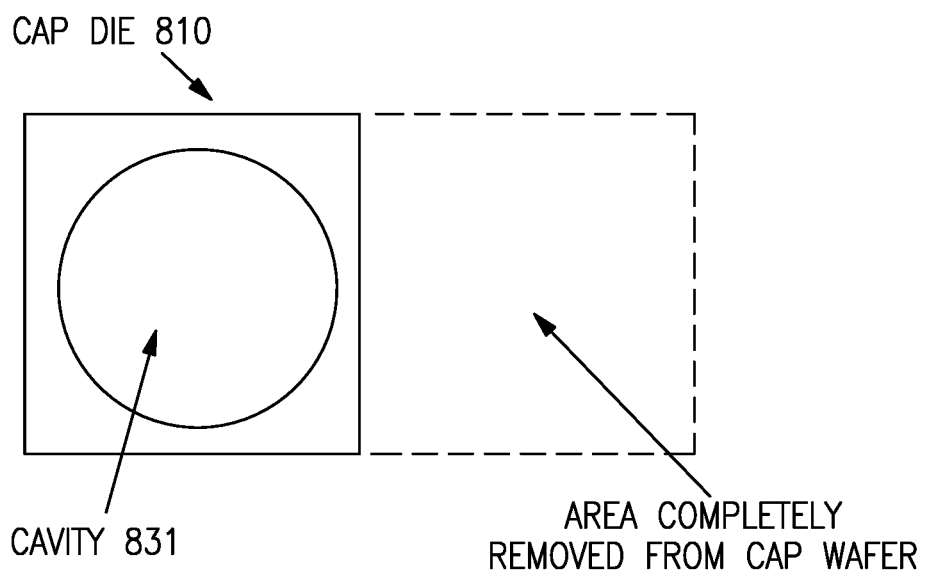
FIG. 8B is a plan view of a cap die including a cavity for one microphone.
Figure 8C:
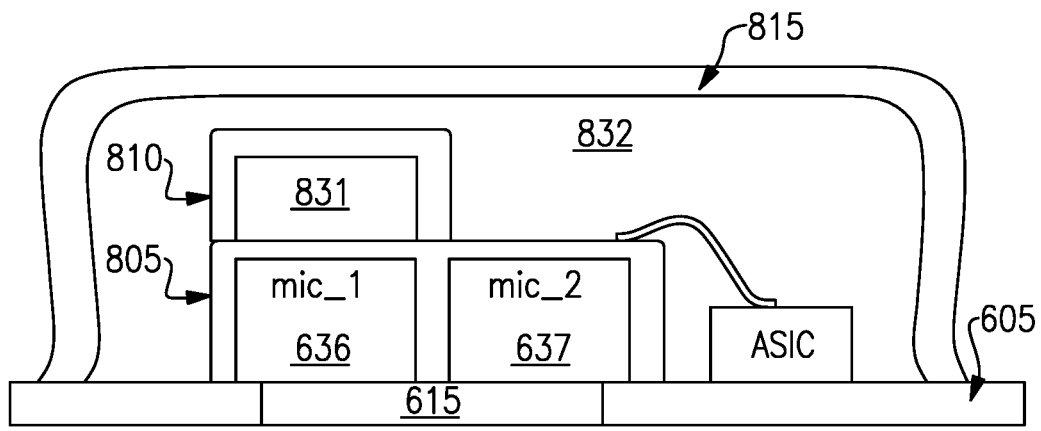
FIG. 8C is a cross-sectional view of a lid-on-laminate package including the die of FIG. 8A and cap die of FIG. 8B.

In accordance with another aspect, packaging for MEMS microphones as disclosed herein may be accomplished through wafer level packaging. A single MEMS die 805 may include two or more microphones (See FIG. 8A) and may be mounted on a laminate or PCB base or bottom 605. Each of the microphones may have its own acoustic port 615 or, alternatively, two or more of the microphones may share an acoustic port 615. A cap die 810 from a cap wafer with a small cavity 831 (See FIG. 8B) may be bonded on top of the MEMS die 805 to form an individual cavity or cavities for one or more of the microphones. A lid 815 formed of, for example, metal may be disposed on the laminate or PCB base or bottom 605 over the MEMS die 805 and cap die 810 to define the back cavity 832 for the microphone or microphones not having a back cavity 831 defined by the cap die 810. One example of such a packaging structure 800 is illustrated in FIG. 8C.

In a MEMS microphone wafer level package as disclosed herein the thickness of cap wafer may be a few hundred um or thicker than 1000 um. The cap wafer may be etched from one side to form cavities on certain areas. Larger cap wafer thickness may provide for the formation of larger cavities. The remaining material in the cap wafer over the cavities forms a membrane that could be a few hundred nm thick or up to a few hundred um thick. The membranes of the cap wafer should be much thicker than the MEMS microphone membranes or cantilevers which are usually a few hundred nm thick so that the cap wafer membrane will have a resonance frequency much higher than the resonance frequency of MEMS microphones. This can be seen for mic in the example of FIG. 8C. As illustrated in FIG. 8B, the cap wafer will be completely etched through on certain areas to remove the material in these areas. Therefore, after wafer bonding, MEMS microphones in these areas will be directly exposed to the large back cavity 832 formed by the metal lid 815. This can be seen for mic2 in the example of FIG. 8C.

Figure 8D:
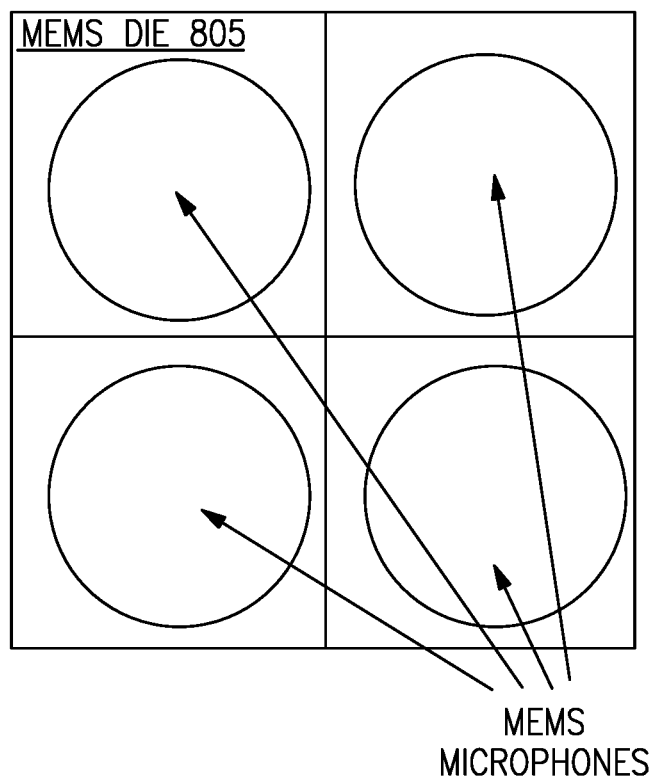
FIG. 8D is a plan view of a die including four piezoelectric microelectromechanical systems microphones.
Figure 8E:
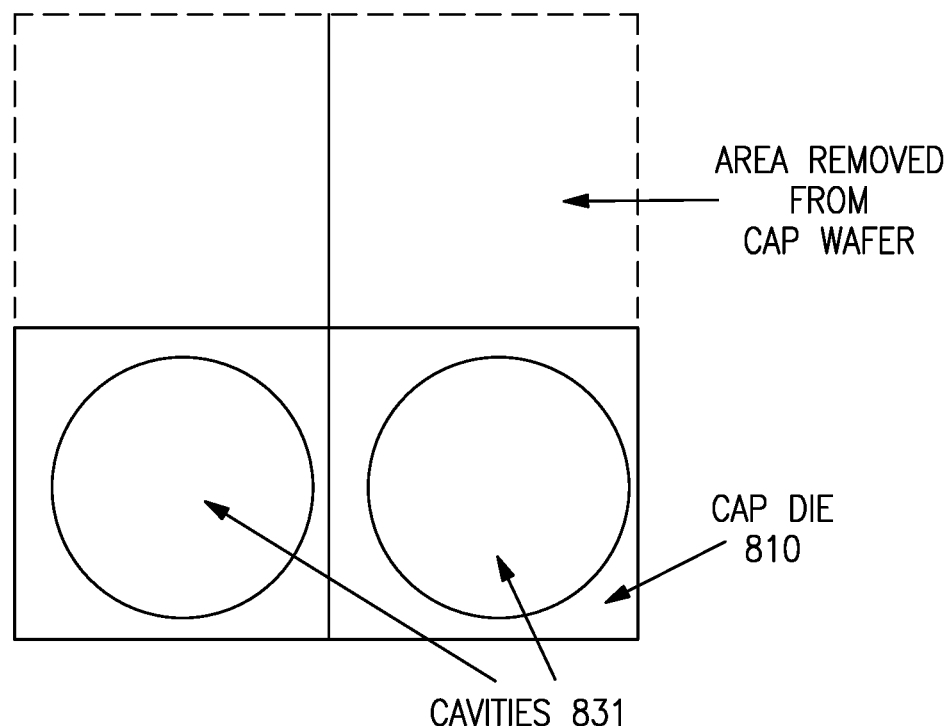
FIG. 8E is a plan view of a cap die having cavities for two microphones.

Another example of forming two back cavities with a cap wafer is shown in FIGS. 8D and 8E. This example has a MEMS die 805 including four microphones with two of the microphones having back cavities 831 defined by a cap die 810 formed from a cap wafer. The other two microphones do not have cap wafer on top, therefore, the back cavity for these microphones will be the cavity 832 in the lid 815 as illustrated in the embodiment of FIG. 8C.

Figure 8F:
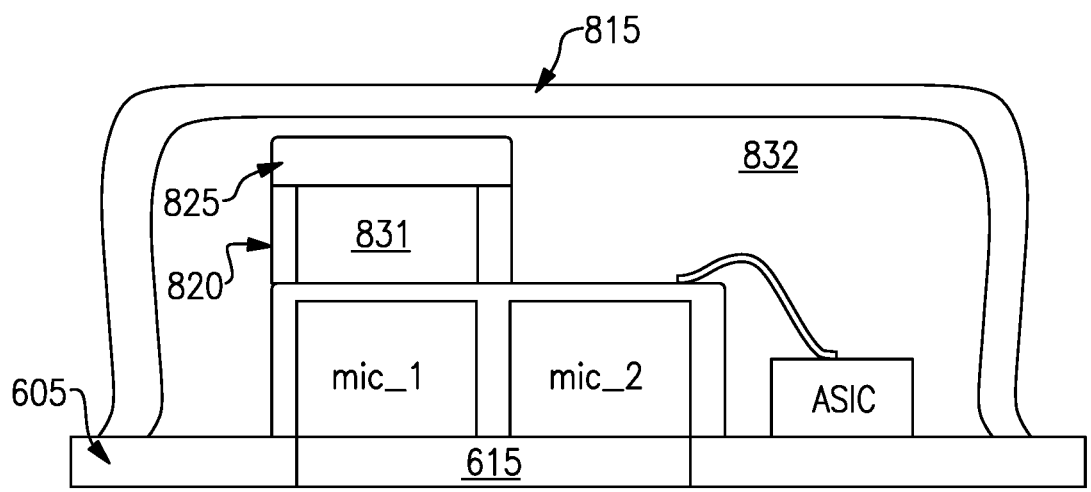
FIG. 8F illustrates a lid-on-laminate package including a back cavity for a microphone having polymeric walls.

Another example of forming two back cavities for two different MEMS microphones as disclosed herein with a polymer-walled cavity is shown in FIG. 8F. The sidewalls 820 of the cavity 831 are polymer walls produced by standard lithographic photoresist patterning. The cavity 831 is completed by a lid 825 formed of, for example, silicon attached on top of the polymer sidewalls 820. A second cavity 832 is defined by a metal lid 815 disposed on the laminate or PCB base or bottom 605 over the microphones and polymer cavity structure.

Figure 9A:
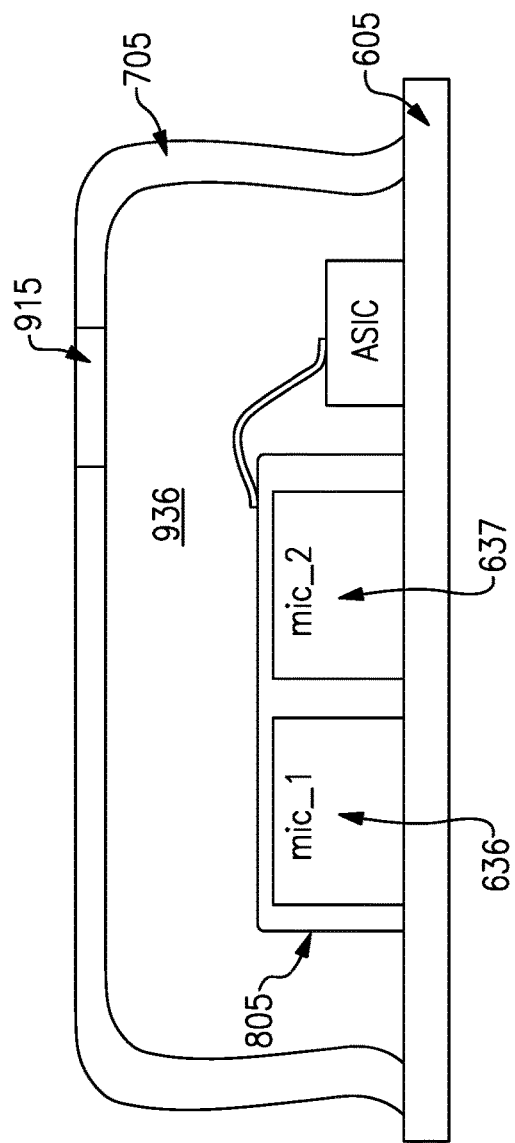
FIG. 9A is a cross-sectional view of a lid-on-laminate package for piezoelectric microelectromechanical systems microphones including a top acoustic port.
Figure 9B:
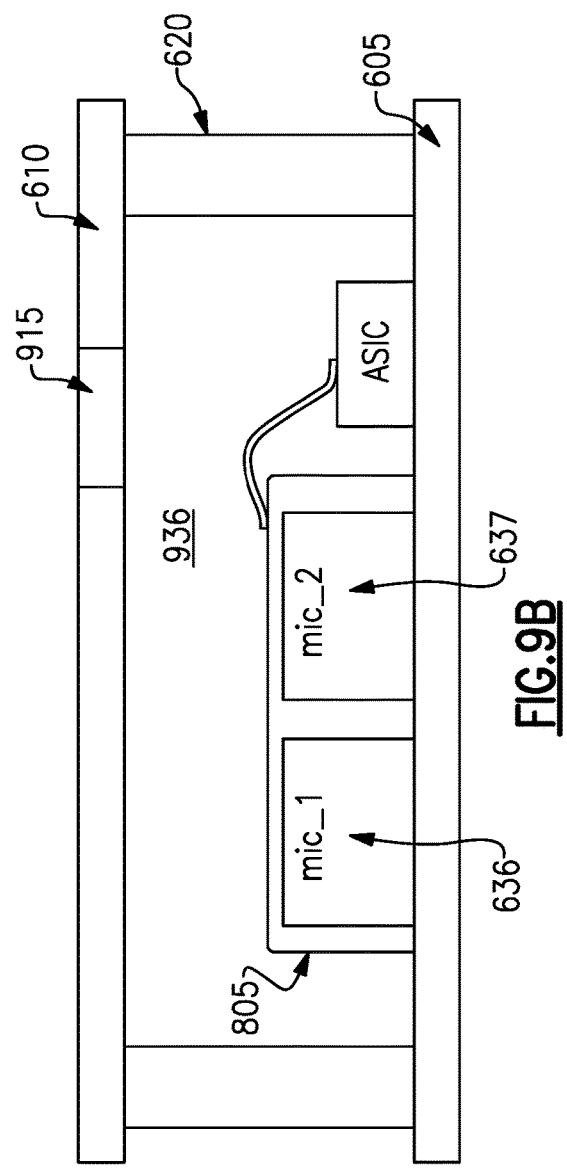
FIG. 9B is a cross-sectional view of a laminate-on-laminate package for piezoelectric microelectromechanical systems microphones including a top acoustic port.

Multi-cavity packages for MEMS microphones as disclosed herein may be formed including a top port rather than acoustic ports in the laminate or PCB base or bottom 605 as disclosed in the above referenced examples. Top-port MEMS microphone packages with multiple cavities are shown in FIGS. 9A and 9B. In some embodiments an acoustic port 915 is opened at the top of the package, for example, in the lid 705 for a lid-on-laminate package (FIG. 9A), or the top PCB 610 for a laminate-to-laminate package (FIG. 9B). The cavities at the back of MEMS die 805 are used as the back cavities 636, 637 for the MEMS microphones. The microphones share a front cavity 936 defined by the laminate or PCB base or bottom 605 and lid 705 (FIG. 9A) or the laminate or PCB base or bottom 605, top PCB 610, and sidewalls 620 (FIG. 9B).

Figure 10:
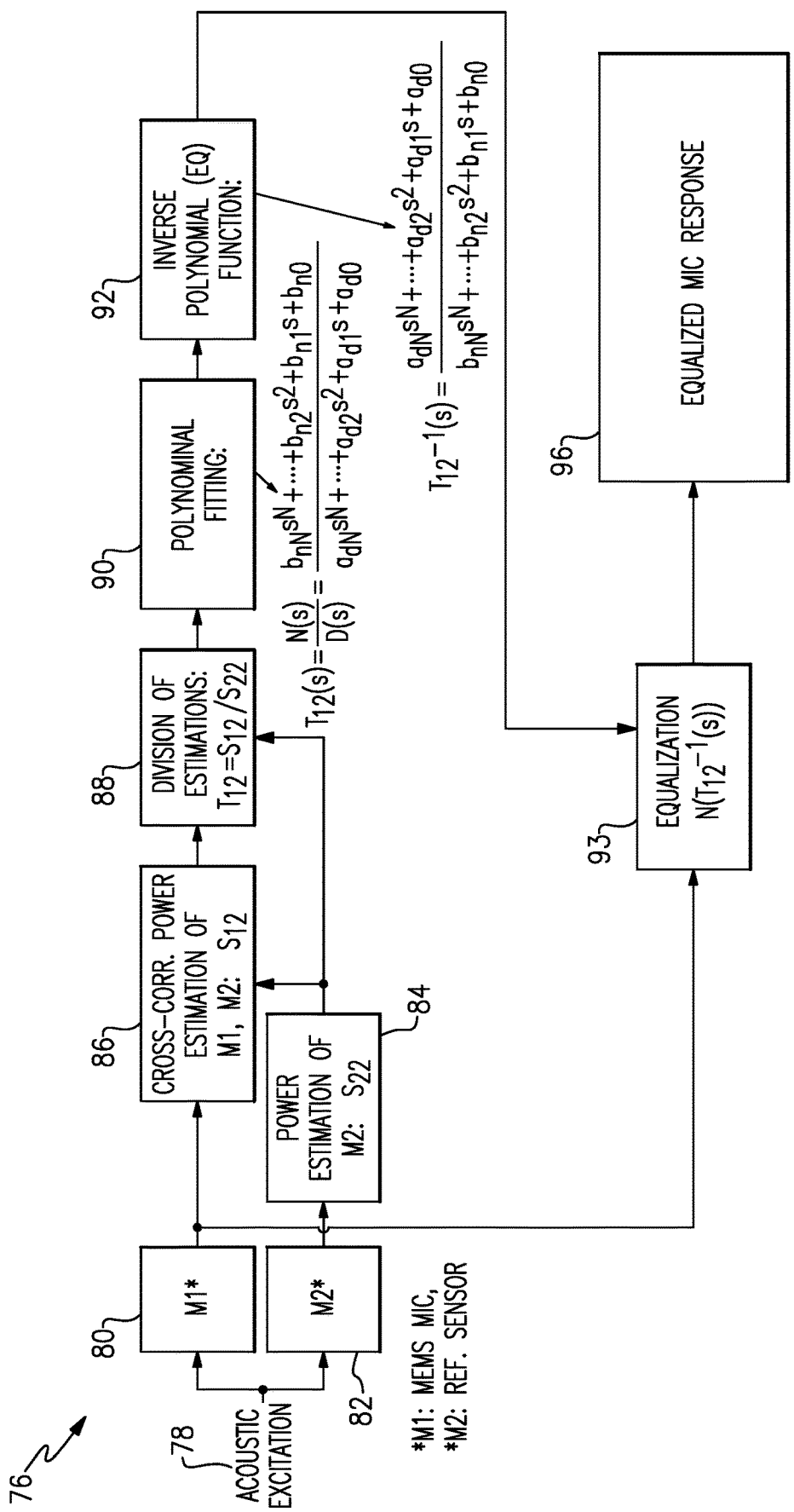
FIG. 10 is a functional block diagram of an equalization method according to another embodiment.

Each of the electronic acoustic devices disclosed herein, including the electronic acoustic devices 2, 12, 34, 42, 50, and 52 utilizes an equalization method for removing the resonance peak in the frequency response of a MEMS microphone. FIG. 10 illustrates such an acoustic equalization method 76.

The equalization method 76 begins with an acoustic wave or excitation 78. The acoustic excitation is passed to at least two MEMS microphones as a common acoustic excitation. As an example and shown in FIG. 10, the at least two microphones include a primary MEMS microphone 80 and a reference MEMS microphone 82 (although the described equalization method is applicable to each of the electronic acoustic devices described herein).

In an Act 84 of the method 76, the transduced signal from the reference microphone 82, which in this example has a higher resonance frequency than the primary microphone 80, is processed to estimate the power spectrum of the transduced signal. In at least one embodiment, the power spectrum is obtained by calculating the Fast Fourier Transform (FFT) of the transduced signal to produce a spectrum estimate $S_{22}$. It is understood that other techniques may be applied to estimate a power spectrum of a transduced signal. For example, Welch estimation, or other techniques that do not use the FFT, such as the Goertzel filter algorithm, may be applied to estimate the power spectrum of the transduced signal. In other examples, Kalman filters may utilized in place of the FFT to extract a transfer function estimate of the microphone(s).

In an Act 86 of the method 76, the cross-correlation $R_{12}$ of time-domain samples produced from the transduced signals of the primary microphone 80 and the reference microphone 82 is obtained. Subsequently, the frequency-domain power spectrum estimate $S_{12}$ of the cross-correlation $R_{12}$ is calculated.

In an Act 88, the power spectrum estimate $S_{12}$ of the cross-correlation $R_{12}$ is divided by the power spectrum estimate $S_{22}$ of the reference sensor to produce a transfer function estimate $T_{12}$ of the primary microphone 80.

In an Act 90, a polynomial of order N is fit to the quotient of the transfer function estimate $T_{12}$, where N≥2.

Once the polynomial is obtained, the method 76 proceeds to an Act 92, where the inverse of the polynomial $T_{12}^{-1}$ is calculated as an equalization function for the primary microphone 80. Certain embodiments utilize a least-squares fit of coefficients to the frequency points of the transfer function estimate $T_{12}$ in the Act 92. In an example, the order N is 3 and at least four frequency points are used in order for there to be a sufficient rank to solve for the curve.

In an Act 93, the frequency response of the primary microphone 80 is filtered with the inverse polynomial $T_{12}^{-1}$ to produce an equalized frequency response in the primary microphone 80 at 96. In the Act 93, the coefficients obtained by the Act 92 are passed to the Act 93, and the Act 93 includes a fetch procedure to fetch the coefficients and re-program/update the filter function N with such coefficients. The Act 93 therefore provides an adaptive filter that is reconfigurable using the coefficients of the equalization function N. The adaptive filter may then continuously process and filter the transduced signal produced by the primary microphone.

As a consequence of performing the equalization method 76, the impact of noise on the estimation of the transfer function of the primary microphone 80 may be reduced. In certain examples, the power spectrum estimation algorithms used in the equalization method 76 use accumulation and averaging of the FFT of the signal samples, which is equivalent to improving the immunity to noise—as noise variance is reduced with averaging, and therefore allows extraction of a 'cleaner' transfer function.

Figure 11:
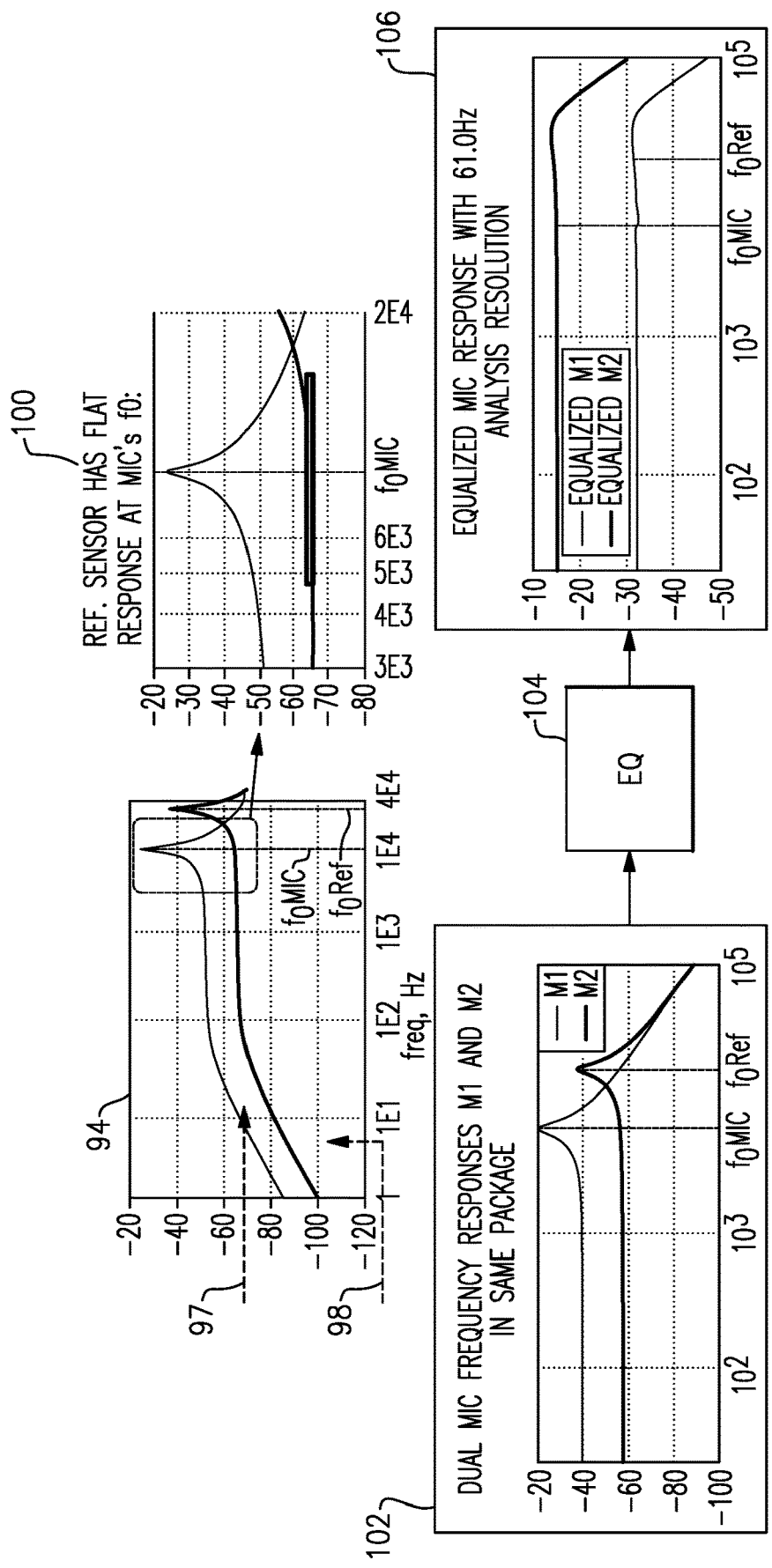
FIG. 11 is a set of frequency response graphs and a functional block diagram according to another embodiment.

FIG. 11 shows a set of frequency response graphs 94, 100, 102, 106 and a functional block diagram 104. Before equalization (e.g., applying the method 76), a frequency response 96 of a primary microphone and a frequency response 98 of a reference microphone are presented in a first frequency response graph 94. The lowest resonant frequency or fundamental frequency $f_0$ is represented by a peak in each frequency response in the graph 94. Of note, as shown in the graph 100, the reference microphone has a substantially flat frequency response at the primary microphone's fundamental frequency. The graph 94 and the graph 100 represent frequency responses without equalization. The graph 100 is a zoomed-in view of the first frequency response graph 94. A condition for the frequency response of the reference microphone therefore, may be that the frequency response is monotonic around the reference microphone's resonance (i.e., no ups and downs in the vicinity of the resonance of the primary microphone, but with the possibility of a sloped (increasing or decreasing) sensitivity.

The graph 102 is equivalent to the first frequency response graph 94 and the graph 100. The graph 102 represents the frequency responses of two microphones (e.g., the primary microphone 80 and the reference microphone 82) in the same package, which are then processed by an equalization module 104 (e.g., having the same or similar functionality as the equalization module 11 in FIG. 1) to produce an equalized frequency response shown in the graph 106, where both frequency responses are roughly flat at the primary microphone's fundamental frequency.

Figure 12A:
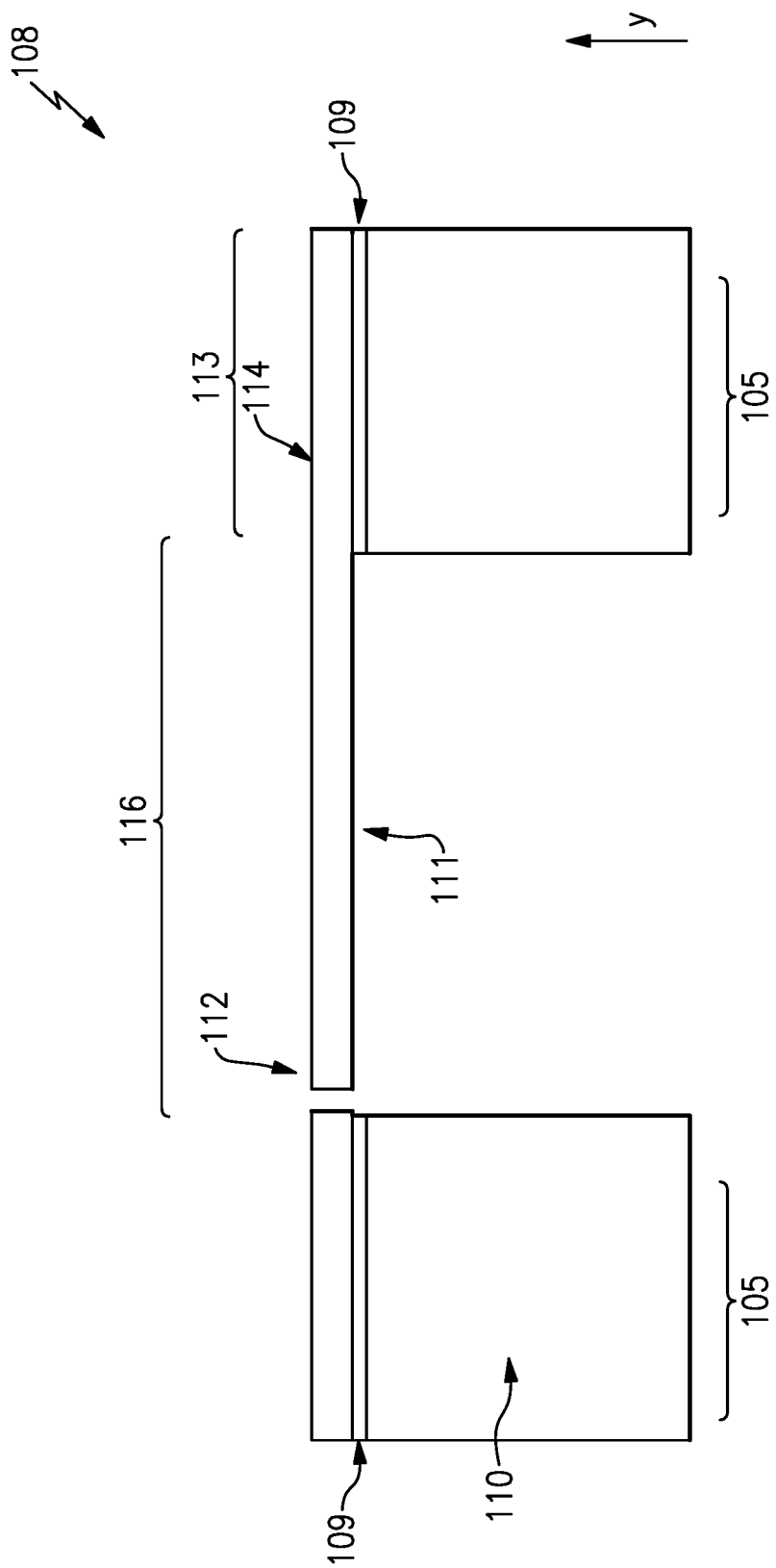
FIG. 12A is a cross sectional view of a microelectromechanical systems microphone with a flat cantilevered beam according to another embodiment.

FIG. 12A shows a cross sectional view of one implementation of a piezoelectric microelectromechanical systems (MEMS) microphone 108. The microphone 108 is a piezoelectric MEMS cantilever microphone usable in any of the electronic acoustic devices 2, 12, 34, 42, 50, 52 described herein. The microphone 108 comprises a substrate 110. The substrate 110 is optionally made of silicon. The substrate 110 has two side walls 105, arranged such that they extend perpendicular to the length of the cantilever. Two further end walls (not shown) complete the cavity on opposite sides, such that they meet the side walls at right angles, and a further structure, described in relation to FIG. 12B later, may be on the underside of the cavity. The walls are preferably around 108-500 micrometers thick. A piezoelectric film layer 111 forms a cantilevered beam 116 over the cavity. At least one of the side walls 105 defines an anchor region 113. The anchor region is preferably around 108-500 micrometers thick. The anchor region 113 is the area where a piezoelectric film layer 111 is coupled to and supported by one of the side walls. The microphone 108 optionally comprises an insulation layer 109 disposed on a surface of the substrate 110. The insulation layer is optionally silicon dioxide. The piezoelectric film layer 111 is supported by the substrate 110 at the anchor region 113, such that the piezoelectric film layer 111 is cantilevered and extends between a fixed end 114 and a free end 112. At least one electrode (not shown) is arranged over the piezoelectric film layer. Preferably, the arrangement comprises multiple electrodes arranged over and under the piezoelectric film layer and, in some arrangements, between such layers. Together the piezoelectric film layer(s) and electrode(s) form a cantilevered beam 116. It will be appreciated that although the beam is illustrated as having a rectangular shape, other shapes may be used. The microphone 108 comprises at least one electrode which may be disposed over the piezoelectric film layer 111, such that the electrode is located on the cavity side of the piezoelectric layer, or such that the electrode is located on the other side of the piezoelectric layer away from the cavity. The electrode is optionally positioned adjacent the anchor region 113. The insulation layer 109 provides insulation between an electrode, disposed on the cavity side of the piezoelectric film layer, and the silicon substrate 110.

Figure 12B:
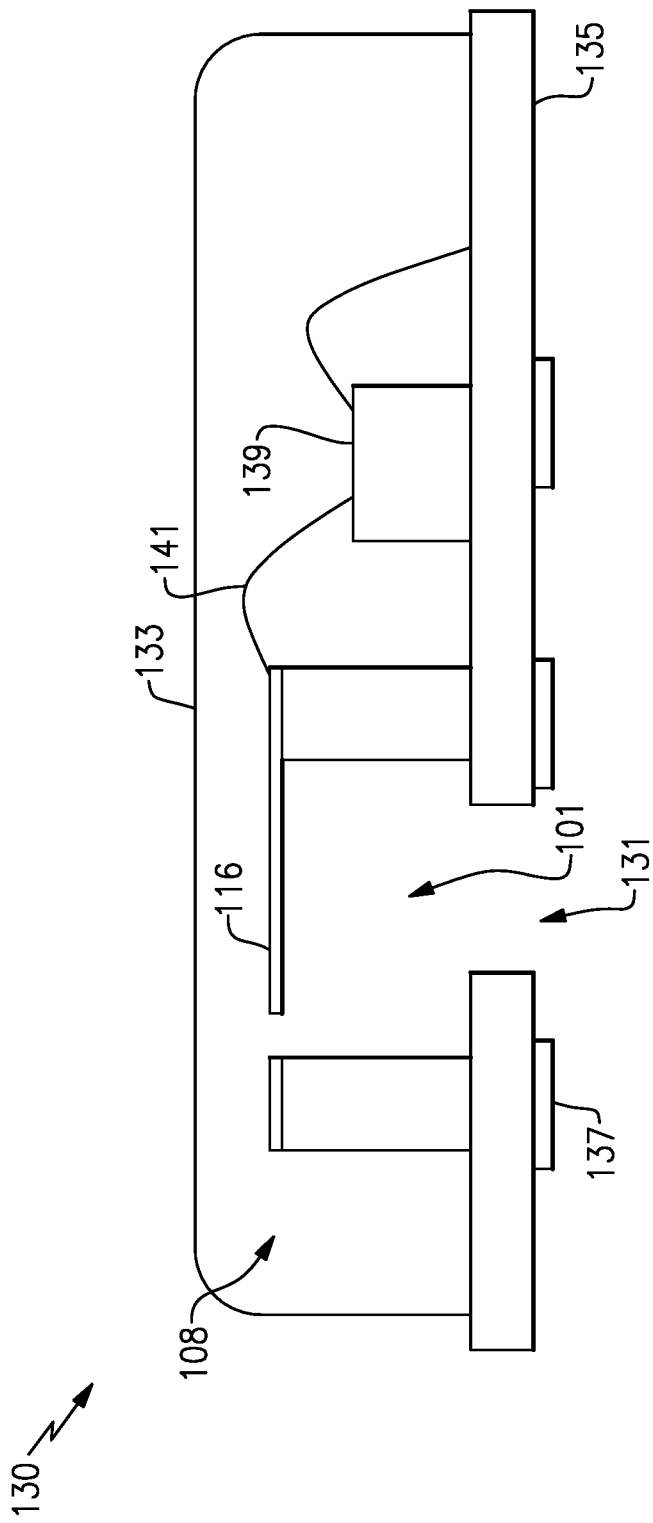
FIG. 12B is a cross sectional view of a microelectromechanical systems microphone arrangement according to another embodiment.

FIG. 12B illustrates a cross sectional view of another microphone arrangement 130. It will be appreciated that this is an example embodiment for illustrative purposes, and the microphone can be included in a variety of different arrangements. As illustrated, the microphone 108 of FIG. 12A is located within a cap 133. The cap may be flexible or rigid, and may be any suitable material such as a metallic material. The cap creates a seal with a substrate 135 (for example a printed circuit board), such that air only flows into and out of the arrangement via a sound inlet 131. The substrate 135 may be any suitable material. The cap 133 also mitigates electromagnetic interference. Sound waves enter the arrangement, causing the cantilevered beam 116 to bend and produce voltage due to the piezoelectric effect, as described herein. The arrangement 130 comprises at least one solder pad 137 such that the microphone arrangement may be soldered to external devices, not shown here. The microphone arrangement further comprises an application specific integrated circuit chip/die ("ASIC") 139. The MEMS microphone is electrically connected by wire bonding 141. Although not shown, it will be appreciated that the wire bonding may be connected to the one or more electrodes of the microphone, as described herein.

It will be noted that FIG. 12B is a cross sectional view of the arrangement 130, such that the one or more solder pads 137, substrate 135, MEMS microphone 108, ASIC 139, and cap 133 extend into the page such that they are three-dimensional, as described in relation to other embodiments disclosed herein.

Figure 13:
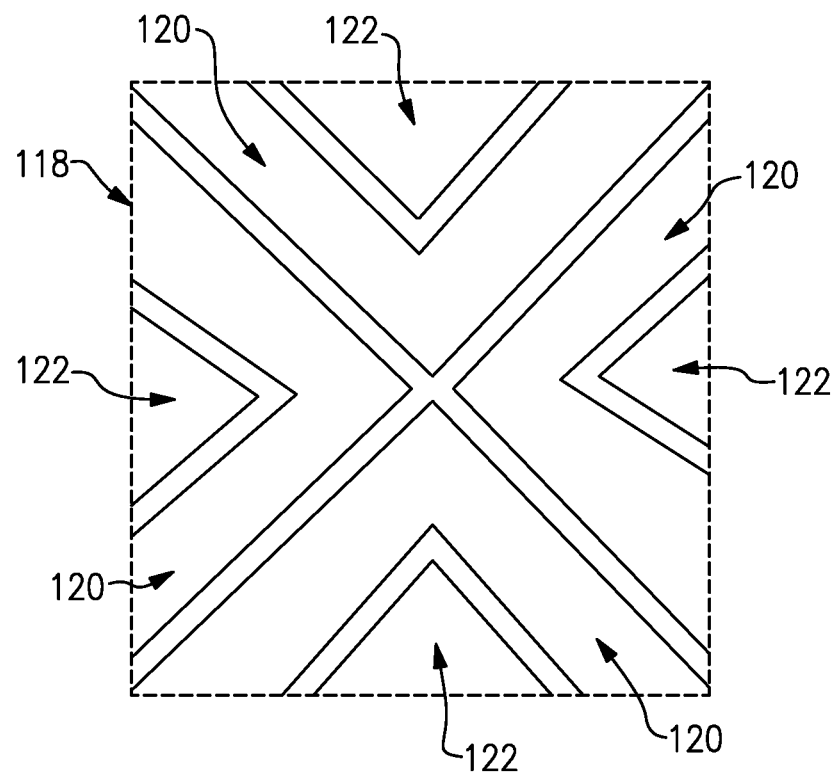
FIG. 13 is a layout of a section of a cantilever beam piezoelectric microphone according to another embodiment.

FIG. 13 shows a layout of a section 118 of a cantilever beam piezoelectric microphone including a first set of cantilever beams 120 and a second set of cantilever beams 122. The first set of beams 120 may correspond to a primary microphone (e.g., the primary microphone 58) and the second set of beams 122 may correspond to a reference microphone (e.g., the reference microphone 62). Each of the triangular tabs formed by the beams 120, 122 and the material therebetween is a piezoelectric material. When the piezoelectric material moves or flexes due to sound waves encountering the material, a voltage is modified corresponding to the amount of movement or flexing. More specifically, the triangular portions contain metal layers that create charges, which are picked up by electrodes. In some examples, all four triangular portions of the first set of beams 120 are tied (i.e., electrically connected) together to act as one microphone and similarly, all four triangular portions of the second set of beams 122 are tied together to act as one microphone. In other examples, one or more individual triangular portions is separately coupled to an equalization module to act as distinct microphones, thereby including more than two microphones according to certain embodiments. For example, an electronic acoustic device may include three microphones, with two of the three microphones made from at least two of the first set of beams 120. The length and/or size of each cantilever beam may be modified to produce a different desired resonant frequency. In an example, the length of a beam is increased to lower its resonant frequency.

FIG. 14 is a schematic diagram of one embodiment of a wireless device 150. The wireless device 150 can be, for example but not limited to, a portable telecommunication device such as, a mobile cellular-type telephone. The wireless device 150 includes an electronic acoustic device 170 as described herein in relation to FIGS. 1-11, and may include one or more of a baseband system 152, a transceiver 154, a front end system 156, one or more antennas 158, a power management system 160, a memory 162, a user interface 164, a battery 166, and an audio codec 168. The electronic acoustic device 170 may supply signals to the audio codec 168 which may encode analog audio as digital signals or decode digital signals to analog. The audio codec 168 may transmit the signals to a user interface 164. The user interface 164 transmits signals to the baseband system 152. The transceiver 154 generates RF signals for transmission and processes incoming RF signals received from the antennas.

The transceiver 154 aids in conditioning signals transmitted to and/or received from the antennas 158.

The antennas 158 can include antennas used for a wide variety of types of communications. For example, the antennas 158 can include antennas 158 for transmitting and/or receiving signals associated with a wide variety of frequencies and communications standards.

The baseband system 152 is coupled to the user interface to facilitate processing of various user input and output, such as voice and data. The baseband system 152 provides the transceiver 154 with digital representations of transmit signals, which the transceiver 154 processes to generate RF signals for transmission. The baseband system 152 also processes digital representations of received signals provided by the transceiver 154. As shown in FIG. 14, the baseband system 152 is coupled to the memory 162 to facilitate operation of the wireless device 150.

The memory 162 can be used for a wide variety of purposes, such as storing data and/or instructions to facilitate the operation of the wireless device and/or to provide storage of user information.

The power management system 160 provides a number of power management functions of the wireless device.

The power management system 160 receives a battery voltage from the battery 166. The battery 166 can be any suitable battery for use in the wireless device, including, for example, a lithium-ion battery.

Embodiments provided herein are applicable to both diaphragm and cantilever based microphones, although other geometries may be more suitable for particular applications (e.g., bridges/clamped-clamped beams). One of ordinary skill in the are would understand how to apply the principles and techniques disclosed herein to other types of microphones beyond diaphragm and cantilever microphones.

While embodiments herein are described with reference to MEMS microphones, it is understood that the principles and techniques described herein are applicable to other types of transducers. For example, embodiments herein may be adapted and used in the equalization of the frequency response of pressure sensors, force sensors, and imaging sensors(where a common excitation signal is substituted for the common acoustic wave described above. An advantage of the devices, systems and methods described herein is that the provided solution is applicable to a wide array of sensors and transducers, particularly when there is little to no control over what the incoming stimulus may be. For example, unlike pink noise generated in a lab to calibrate a MEMS microphone, MEMS microphones in the real world often fall out of calibration and/or never encounter the exact type of noise simulated in a lab. By deliberately using a reference transducer with a higher or lower frequency response than a primary transducer, the techniques provided herein enable equalization of the frequency response of the primary transducer while keeping the resonance frequency in band for the primary transducer. Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An electronic device package comprising:
    an electronic acoustic device including
        a primary microphone having a frequency response having a resonance frequency,
        a reference microphone having a frequency response including a resonance frequency, the primary microphone and the reference microphone configured to substantially simultaneously receive a common acoustic signal to produce a transduced signal of the primary microphone and a transduced signal of the reference microphone, the resonance frequency of the reference microphone being different than the resonance frequency of the primary microphone, and
        an equalization module configured to equalize the frequency response of the primary microphone based on the transduced signal of the primary microphone and the transduced signal of the reference microphone,
    the package defining a first back cavity of the primary microphone and a second back cavity of the reference microphone, the second back cavity being acoustically isolated from the first back cavity.

2. The package of claim 1 wherein each of the primary microphone and the reference microphone is a micro-electromechanical system (MEMS) microphone.

3. The package of claim 1 wherein both the first back cavity and the second back cavity are sealed.

4. The package of claim 1 having a laminate-to-laminate structure in which a base of the package upon which the primary microphone and reference microphone are mounted includes a laminate board, and a ceiling of the package above the primary microphone and reference microphone also includes a laminate board.

5. The package of claim 4 further comprising outer walls formed of a laminate board.

6. The package of claim 5 further comprising a central wall separating a cavity defined by the base, ceiling, and outer walls into the first back cavity and the second back cavity.

7. The package of claim 6 further comprising a conductive material coating internal portions of one of the base, ceiling, or outer walls.

8. The package of claim 6 further comprising a conductive material coating external portions of one of the base, ceiling, or outer walls.

9. The package of claim 4, further comprising a first metal wall surrounding the primary microphone and a second metal wall surrounding the reference microphone, the base, ceiling and first metal wall defining the first back cavity, the base, ceiling and second metal wall defining the second back cavity.

10. The package of claim 9 wherein the first and second metal walls are spaced from one another.

11. The package of claim 9 wherein the first and second metal walls abut one another.

12. The package of claim 9 wherein the first and second metal walls are defined by apertures formed in a single metal plate.

13. The package of claim 1 having a lid-on-laminate structure in which a base of the package upon which the primary microphone and reference microphone are mounted includes a laminate board, and a ceiling of the package above the primary microphone and reference microphone includes a metal lid.

14. The package of claim 13 wherein a first metal lid and the base define the first back cavity, and a second metal lid and the base define the second back cavity.

15. The package of claim 13 wherein a single metal lid includes a portion contacting the base between the reference microphone and the primary microphone, the base and the single metal lid defining both the first back cavity and the second back cavity.

16. The package of claim 13 further comprising a wall extending from an upper surface of the base to a lower surface of the metal lid, the base, wall, and metal lid defining both the first back cavity and the second back cavity.

17. The package of claim 13 wherein the metal lid includes a metal block having first and second recesses defined therein, the base and first recess defining the first back cavity, the base and the second recess defining the second back cavity.

18. The package of claim 1 having a lid-on-laminate structure in which a base of the package upon which the primary microphone and reference microphone are mounted includes a laminate board, a ceiling of the package above the primary microphone and reference microphone includes a metal lid, and a cap die is disposed over either the primary microphone and defines the first back cavity or is disposed over the reference microphone and defines the second back cavity.

19. The package of claim 18 wherein the base and metal lid define the one of the first back cavity or second back cavity not defined by the cap die.

20. The package of claim 18 wherein the cap die includes cap die walls formed of a polymer and a cap die lid, the cap die walls and cap die lid defining one of the first back cavity or the second back cavity.

21. The package of claim 1 having a top port structure in which a base of the package upon which the primary microphone and reference microphone are mounted includes a laminate board, a ceiling and walls of the package above and surrounding the primary microphone and reference microphone includes a metal lid, and an acoustic port is defined in the metal lid.

22. The package of claim 21 wherein the base and metal lid define a front cavity that is shared by the primary microphone and reference microphone.

23. The package of claim 1 having a top port structure in which a base of the package upon which the primary microphone and reference microphone are mounted includes a laminate board, a ceiling of the package above the primary microphone and reference microphone includes a laminate board, and an acoustic port is defined in the ceiling.

24. The package of claim 23 further comprising outer walls formed of a laminate board, the base, ceiling, and outer walls defining a front cavity that is shared by the primary microphone and reference microphone.

\* \* \* \* \*

UNITED STATES PATENT AND TRADEMARK OFFICE
CERTIFICATE OF CORRECTION

PATENT NO.       : 12,185,055 B2
APPLICATION NO.  : 18/045887
DATED            : December 31, 2024
INVENTOR(S)      : Guofeng Chen et al.

Page 1 of 1

It is certified that error appears in the above-identified patent and that said Letters Patent is hereby corrected as shown below:

In the Specification

Column 12, Line 39, delete "mic" and insert -- mic1 --

Signed and Sealed this
Fourth Day of February, 2025

Coke Morgan Stewart
*Acting Director of the United States Patent and Trademark Office*